US006635184B1

(12) United States Patent
Cohen et al.

(10) Patent No.: US 6,635,184 B1
(45) Date of Patent: *Oct. 21, 2003

(54) METHOD FOR PATTERN-ETCHING ALUMINA LAYERS AND PRODUCTS

(75) Inventors: Uri Cohen, 765 San Antonio Rd., #53, Palo Alto, CA (US) 94303; Gene Patrick Bonnie, Eden Prairie, MN (US)

(73) Assignee: Uri Cohen, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/553,691

(22) Filed: Apr. 21, 2000

Related U.S. Application Data

(60) Continuation of application No. 08/598,933, filed on Feb. 9, 1996, now Pat. No. 6,059,984, which is a continuation of application No. 08/502,442, filed on Jul. 13, 1995, now Pat. No. 5,820,770, which is a continuation-in-part of application No. 08/135,033, filed on Oct. 12, 1993, now abandoned, which is a division of application No. 07/918,725, filed on Jul. 21, 1992, now Pat. No. 5,326,429.

(51) Int. Cl.[7] .............................. C23F 1/00; G11B 5/127
(52) U.S. Cl. .............................. 216/22; 216/41; 216/49; 216/51; 216/101; 216/108; 216/109
(58) Field of Search .............................. 216/22, 33, 38, 216/39, 41, 52, 88, 101, 49, 51, 108, 109

(56) References Cited

U.S. PATENT DOCUMENTS

| 3,908,194 A | * | 9/1975 | Romankiw ............... 29/603.25 |
| 4,016,601 A | | 4/1977 | Lazzari ...................... 360/122 |
| 4,190,871 A | | 2/1980 | Walraven ................... 360/113 |

(List continued on next page.)

FOREIGN PATENT DOCUMENTS

| GB | 689976 | 4/1953 | | |
| JP | A 54118345 | 9/1979 | ......... | C23C/16/06 |
| JP | 55-30826 A | * 3/1980 | | |
| JP | A 55030826 | 3/1980 | | |
| JP | A 56048147 | 5/1981 | ......... | H01L/21/78 |
| JP | 62231414 | 10/1987 | | |
| JP | 62-231414 A | * 10/1987 | | |
| JP | 4-281205 A | * 10/1992 | | |

OTHER PUBLICATIONS

"Use of lithographically defined metal masks in selective chemical etching of patterns in thin films: microelectronic applications" by J. Khan, *Thin Solid Films*, vol. 206, pp. 269–274, 1991.

J. Khan et al., "Applications of Laser Etching In Thin Film Head Fabrication", *Extended Abstracts*, The Electrochemical Society, Fall Meeting, Hollywood, Florida, Oct. 1989, pp. 438–439.

Shyam C. Das and Jamal Khan, "Applications of Laser Etching In Thin Film Head Fabrication", *Proceedings of the Symposium on Magnetic Materials, Processes and Devices*, Hollywood, Florida, Oct. 1989, pp. 279–288.

(List continued on next page.)

*Primary Examiner*—Anita Alanko

(57) ABSTRACT

A method for pattern-etching thick alumina layers in the manufacture of thin film heads (TFH) by using compatible metallic mask layers and a wet chemical etchant. The deep alumina etching facilitates a studless TFH device where the coil and bonding pads are deposited and patterned simultaneously, and vias are later etched through the alumina overcoat layer to expose the bonding pads. The method also enables the etching of scribe-line grooves of street and alleys across the wafer for sawing and machining of sliders. These grooves eliminate most alumina chipping due to stress and damage introduced by the sawing and machining operations. Similarly, pattern-etching of the alumina undercoat facilitates the formation of precise craters for recessed structures. These can improve planarity and alleviate problems related to adverse topography and elevated features of TFH devices.

59 Claims, 17 Drawing Sheets

U.S. PATENT DOCUMENTS

| | | | | |
|---|---|---|---|---|
| 4,190,872 A | | 2/1980 | Jones, Jr. et al. | 360/125 |
| 4,219,853 A | | 8/1980 | Albert et al. | 360/103 |
| 4,281,357 A | | 7/1981 | Lee | 360/125 |
| 4,315,291 A | | 2/1982 | Lazzari | 360/113 |
| 4,379,022 A | | 4/1983 | Melcher et al. | 156/643 |
| 4,489,105 A | | 12/1984 | Lee | 427/123 |
| 4,592,801 A | | 6/1986 | Hara et al. | 156/643 |
| 4,619,731 A | * | 10/1986 | Buttry et al. | 216/101 |
| 4,652,954 A | | 3/1987 | Church | 360/120 |
| 4,791,719 A | | 12/1988 | Kobayashi et al. | 29/603 |
| 4,800,454 A | | 1/1989 | Schwarz et al. | 360/103 |
| 4,856,181 A | | 8/1989 | Pichler et al. | 29/603 |
| 4,896,417 A | | 1/1990 | Sawada et al. | 29/603 |
| 4,938,928 A | * | 7/1990 | Koda et al. | 338/34 |
| 4,949,209 A | | 8/1990 | Imanaka et al. | 360/126 |
| 5,059,278 A | | 10/1991 | Cohen et al. | 156/643 |
| 5,141,623 A | * | 8/1992 | Cohen et al. | 204/192.34 |
| 5,195,233 A | | 3/1993 | Kitamura et al. | 29/603 |
| 5,256,249 A | | 10/1993 | Hsie et al. | 156/656 |
| 5,269,879 A | | 12/1993 | Rhoades et al. | 156/643 |
| 5,272,111 A | | 12/1993 | Kosaki | 437/192 |
| 5,293,288 A | | 3/1994 | Ishikawa et al. | 360/103 |
| 5,326,429 A | * | 7/1994 | Cohen et al. | 216/103 |
| 5,650,897 A | * | 7/1997 | Cohen et al. | 29/603.15 |
| 5,820,770 A | * | 10/1998 | Cohen et al. | 216/22 |
| 5,888,411 A | * | 3/1999 | Cohen | 216/101 |
| 6,059,984 A | * | 5/2000 | Cohen et al. | 216/103 |

OTHER PUBLICATIONS

Uri Cohen, "A Studless Thin Film Head Produced By Deep Alumina Etching", *Extended Abstracts*, The Electrochemical Society, Fall Meeting, New Orleans, Louisiana, Oct. 1993.

Uri Cohen, "A Studless Thin Film Head Produced By Deep Alumina Etching", *Proceedings of the Symposium on Magnetic Materials, Processes and Devices*, The Electrochemical Society, Fall Meeting, New Orleans, Louisiana, Oct. 1993.

D. Chapman, entitled "A New Approach to Making Thin Film Head–Slider Devices", IEEE Transactions on Magnetics, vol. 25, No. 5, Sep. 1989.

* cited by examiner

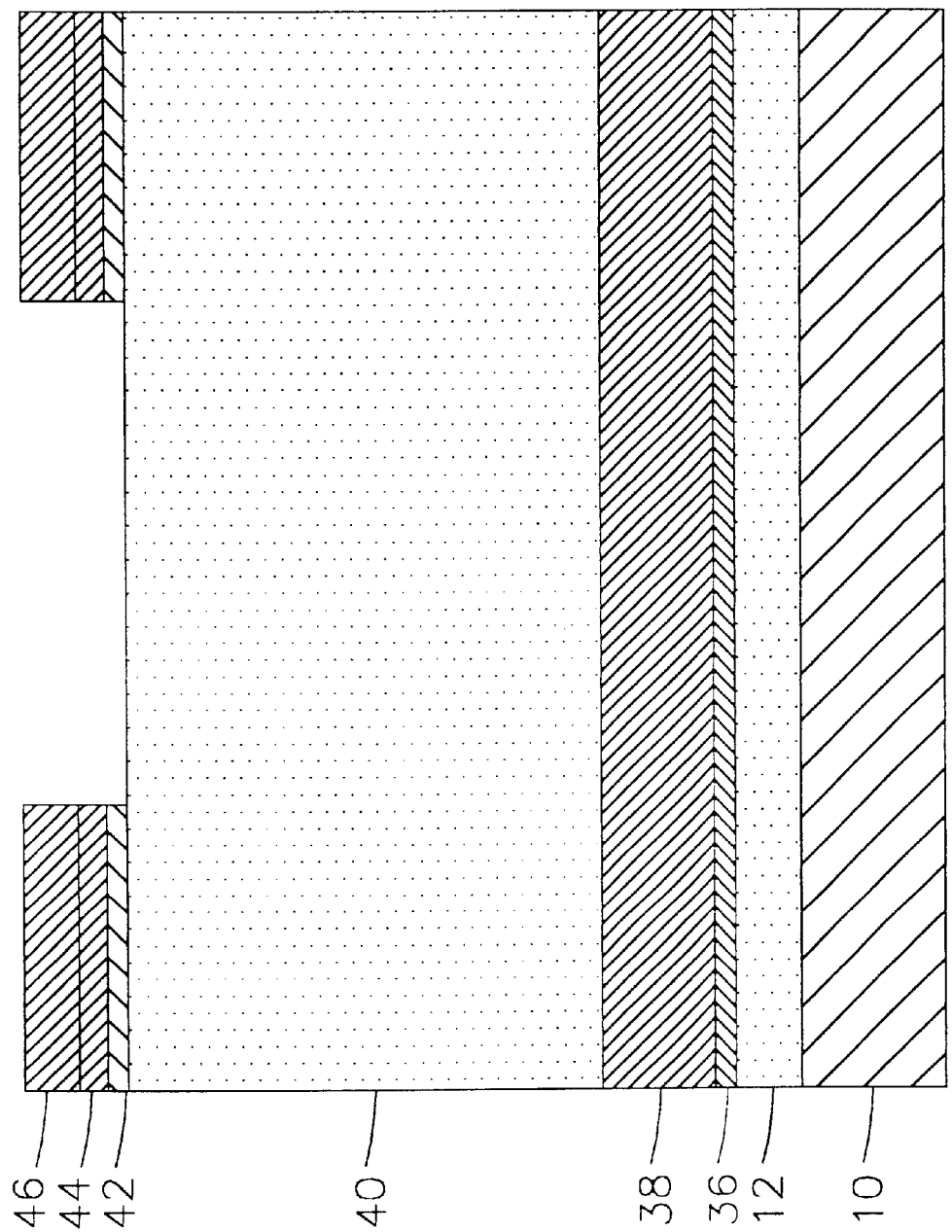

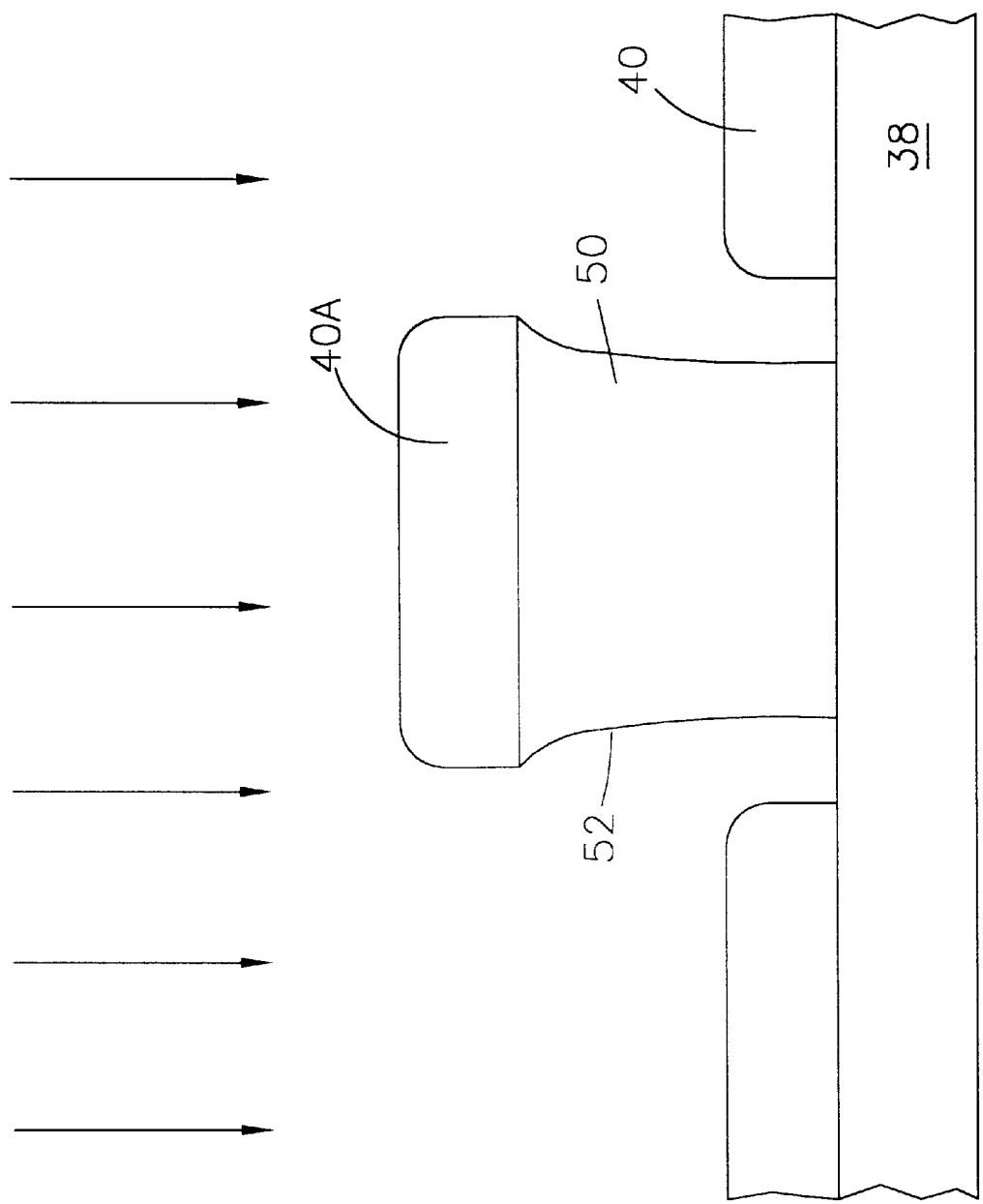

METHOD FOR PATTERN-ETCHING ALUMINA LAYERS AND PRODUCTS

This application is a continuation of Ser. No. 08/598,933, Feb. 9, 1996, now U.S. Pat. No. 6,059,984, which is continuation of Ser. No.08/502,442, Jul. 13, 1995, now U.S. Pat. No. 5,820,770, which itself is a continuation-in-part of Ser. No. 08/135,033, Oct. 12, 1993, abandoned, which is a division of Ser. No. 07/918,725, Jul. 21, 1992, now U.S. Pat. No. 5,326,429.

BACKGROUND OF THE INVENTION

1. Field of the Invention

This invention relates to magnetic thin film heads (TFH) for recording and reading magnetic transitions on a moving magnetic medium. It is applicable to either inductive or magnetoresistive (MR) elements.

In particular, the invention relates to a method of etching deep vias through the thick alumina overcoat in order to expose underlying bonding pads, thereby completely eliminating fabrication of the studs (or bonding posts), a method of etching the undercoat to define scribe-line grooves of streets and alleys across the wafer for sawing (or dicing) and machining of the sliders, and a method of pattern-etching the alumina undercoat, prior to the wafer fabrication, to create precise craters for recessed structures or open vias to the substrate for lightning arresters.

2. Background of the Prior Art

Magnetic TFH transducers are known in the prior art. See, e.g. U.S. Pat. Nos. 4,016,601; 4,190,872; 4,652,954; 4,791,719 for inductive devices and U.S. Pat. Nos. 4,190,871 and 4,315,291 for magnetoresistive (MR) devices.

In the operation of a typical inductive TFH device a moving magnetic storage medium is placed near the exposed pole-tips of the TFH transducer. During the read operation, the changing magnetic flux of the moving storage medium induces a changing magnetic flux upon the pole-tips and the gap between them. The magnetic flux is carried through the pole-tips and yoke core around spiralling conductor coil winding turns located between the yoke arms. The changing magnetic flux induces an electrical voltage across the conductor coil. The electrical voltage is representative of the magnetic pattern stored on the moving magnetic storage medium. During the write operation, an electrical current is caused to flow through the conductor coil. The current in the coil induces a magnetic field across the gap between pole-tips. A fringe field extends into the nearby moving magnetic storage medium, inducing (or writing) a magnetic domain (in the medium) in the same direction. Impressing current pulses of alternating polarity across the coil causes the writing of magnetic domains of alternating polarity in the storage medium.

Magnetoresistive (MR) TFH devices can only operate in the read mode. The electrical resistance of an MR element varies with its magnetization orientation. Magnetic flux from the moving magnetic storage medium induces changes in this orientation. As a result, the resistance of the MR element to a sensing electric current changes accordingly. The varying voltage signal is representative of the magnetic pattern stored on the magnetic medium.

In the manufacturing of TFH transducers for magnetic recording, a large number of devices are fabricated simultaneously in deposited and patterned layers on a ceramic wafer. When completed, the wafer is cut (or diced) and machined into individual slider transducers. The main elements of a TFH inductive transducer, roughly in the order in which they are deposited, are the (alumina) undercoat, the bottom magnetic pole, the flux gap material to provide spacing between the bottom and top magnetic pole-tips, one or more levels of electrical conductive coil winding interposed within insulation layers, the top magnetic pole, elevated studs (or posts) for connecting the coil to bonding pads (above the overcoat), a thick (alumina) overcoat, and the bonding pads.

Usually the studs are made of about 25–50 $\mu$m thick copper, plated through a thick photoresist mask right after the completion of the top magnetic pole and prior to the deposition of thick alumina overcoat. For reasons of uniformity and reproducibility, the studs are designed to extend to a level about 10 $\mu$m above the highest spot of the TFH device (the back yoke of the top pole). For each coil level the stud thickness must be increased by at least 6–9 $\mu$m. For similar reasons, the alumina overcoat thickness must exceed the stud thickness by about 10 $\mu$m, requiring an overcoat about 35–60 $\mu$m thick. Following the overcoat deposition, the studs are covered by the alumina overcoat. The wafer is then lapped (ground) down to expose the copper studs. Next, (gold) bonding pads are fabricated over the alumina overcoat to contact the exposed studs. The pads are later used for bonding wires to external circuitry to the read/write channel. Fabrication of studs and bonding pads is described in U.S. Pat. No. 4,219,853, for example. It is similar in both inductive and MR devices. For TFH devices combining an inductive write element and an MR read element, one on top of the other, the stud and alumina overcoat operations have to be repeated. This may bring the total thickness of the studs to about 40–70 $\mu$m, and the total alumina overcoat thickness to about 50–80 $\mu$m. As the alumina deposition process is relatively slow, about 1–2 $\mu$m/hour, it can easily become the bottleneck (1–3 days) in the process flow. Furthermore, alumina sputtering equipment is very costly. As a result, the alumina overcoat deposition is by far the costliest and the slowest step in TFH wafer fabrication.

The integrity and chipping resistance of the alumina overcoat are directly related to its thickness and stress. The thicker the alumina layer, the more stress it incorporates. The alumina overcoat's stress also adversely affects the noise performance of the TFH device, since it is in direct contact with the top magnetic pole. Moreover, tall features of the device, such as the studs, impair the integrity of the deposited alumina in the local surrounding area. Sawing and machining operations subject the alumina overcoat to local stresses which often result in excessive chipping and rejects.

Very thick studs require a relatively long plating time and the thickness uniformity is quite difficult to control. To achieve the required thickness, stud plating dictates the use of a dry film photoresist which is difficult to strip and process. The usual fabrication of studs and bonding pads demands numerous steps of photomasking, deposition of seed-layers, plating, stripping, and etching. The elaborate structure of the studs and bonding pads, including coil leads, permalloy, and all the seed-layers, may involve some 10–15 individual metallic layers deposited in succession on top of each other. The probability of bonding failures due to inadequate adhesion between any two of these metallic layers is directly proportional to the number of these layers. Thus reliability of the bond strength is adversely affected by the large number of the metallic layers in the structure. The poor integrity of the alumina overcoat in the locales surrounding the studs further degrades the bond strength and often impairs the fabrication of bonding pads due to "loops" of collapsed alumina around the studs. The latter appear following the lapping of the alumina overcoat to expose the studs, and are due to the poor integrity of the alumina surrounding the studs.

Copper residues and contamination, originating from copper seed-layers used for the coil and stud platings, may cause shorts and impair the corrosion resistance of the TFH device. Copper coil seed-layer residues are often found to be responsible for intensified corrosion susceptibility of exposed pole-tips in the air bearing surface (ABS). This poor corrosion resistance is due to galvanic action between the two dissimilar metals (Cu and Ni—Fe) contacting at the corners (for wings) of the pole-tips. Similarly, the copper seed-layer of the studs is often found to degrade coil-to-core resistance due to full or partial shorts. The copper coil itself is sometimes subject to capricious variations of its electrical resistance due to corrosion and oxidation of the copper turns during elevated temperature curing cycles of the photoresist insulation layers.

SUMMARY OF THE INVENTION

The present invention provides an economical method for fast and precise patterning of thick sputter-deposited alumina layers by etching through appropriate metallic masks. It further provides improvements in product design and performance which avoid the above-described shortcomings of the prior art. In particular, the precise patterning of thick alumina layers by etching enables the fabrication of studless TFH devices, scribe-line grooves for dicing, recessed craters for TFH devices, and lightning arresters.

Elimination of the studs simplifies the wafer fabrication in a very substantial way. It curtails about 20–30% of the total wafer processing steps and reduces the alumina overcoat thickness by about 30–50%. It thus produces the substantial benefits of reducing processing costs, decreasing device noise, and improving throughput, consistency, bonding strength, and corrosion resistance. Alumina chipping is usually a major contributor to yield loss. Etching scribe-line grooves facilitates significant reduction of alumina chipping during slider machining and later in tests and service. It thus significantly improves total device yields. Pattern-etching precise craters in the alumina undercoat facilitates the fabrication of TFH devices with recessed structures or features. These can improve device planarity and alleviate problems associated with tall features of multi-level coil designs. They can also improve the symmetry of pole-tips configuration. Similarly, etching vias through the alumina undercoat layer enables the construction of lightning arresters by electrically connecting the magnetic core to the substrate, which will be grounded in the process of packaging the slider. The lightning arresters provide grounding to prevent arcing between the magnetic core and rotating disk.

In accordance with this invention, the patterning of thick sputter-deposited alumina layers is accomplished by, first, depositing compatible metallic layers on the alumina, coating the metallic layers with photoresist, patterning the photoresist by photolithography, etching the metallic layers (in sequence) through the photoresist mask, stripping the photoresist, wet chemical pattern-etching the thick alumina layer through the metallic mask, and removing (in sequence) the metallic masking layers. A preferred etchant comprising dilute HF in water (1:2 by volume ratio) has been found to provide fast (about 1 $\mu$m/min), extraordinarily uniform (better than $\sigma=1\%$ across a wafer), and accurate etching of thick alumina layers. The etching can be conveniently performed by spray or immersion. A compatible metallic mask must be used with the dilute HF etchant since photoresist masks lift-off from the alumina surface after a very short time. A preferred metallic mask comprises a very thin (100–300 Å) Cr or Ti adhesion layer covered by a gold (Au) layer, about 0.3–0.5 $\mu$m thick. To avoid porosity in the gold layer and for economic reasons, at least one half of the gold thickness can be plated from an high purity (99.9%) "soft" gold bath.

Other wet chemical etchants may also be used to pattern thick alumina layers. These may include hot phosphoric acid ($H_3PO_4$) and hot strong bases such as KOH, NaOH, Ca(OH)$_2$, and hot organic amines.

In accordance with the invention a studless TFH device with gold coil and bonding pads, patterned and plated simultaneously, is provided. Following the alumina overcoat deposition, vias are etched through it to expose the bonding pads. This eliminates copper altogether from the TFH device, resulting in less maintenance and significantly improved reliability, corrosion resistance, and consistency of the coil resistance. Similarly, the thick alumina is pattern-etched to form scribe-line grooves which minimize alumina chipping during sawing and machining. Other improvements in a TFH device resulting from deep alumina pattern-etching include the formation of recessed craters to improve planarity and pole-tips symmetry and the formation of vias to the substrate for lightning arresters connecting the magnetic core to the substrate.

Several alternative embodiments which do not require etching the alumina layer are also disclosed. One such alternative includes forming "plugs" over the bonding pads prior to the deposition of the alumina overcoat and then lapping the wafer to expose the plugs, which are then removed by selective etching (or stripping). Another alternative includes forming plugs with negative-slope walls prior to the deposition of the alumina layer, depositing the alumina layer, and dissolving the plugs with an appropriate selective etchant, thereby "lifting-off" the alumina overlying the plugs.

In an alternative embodiment, vias etched in the alumina layer are partially or wholly filled with studs and bonding pads, or with bonding pads alone, thereby eliminating the need for the tip of the wire-bonding tool to fit entirely inside the vias when making the wire bonds.

An object of this invention is to provide a method of pattern-etching through an alumina layer.

Another object is to provide a studless TFH device.

A further object of this invention is to provide a simple, fast, and low cost method to eliminate many processing steps and increase throughput in the process of fabricating a TFH device.

An additional object is to significantly decrease alumina overcoat thickness to further reduce processing cost and improve reliability and throughput.

Another object is to decrease alumina overcoat stress and related chipping and device noise.

An additional object of this invention is to improve bonding strength and reliability by eliminating many metallic layers in the stud structure.

An additional object is to eliminate dry photoresist processing.

An additional object is to provide gold coil and bonding pads, fabricated simultaneously, to further delete some processing steps and to entirely eliminate copper material in the TFH device.

Another object of the invention is to improve the corrosion resistance of a TFH device.

A further object of the invention is to provide scribe-line grooves for dicing and slider machining to reduce alumina chipping and improve yields.

Another object of the invention is to provide vias through the alumina undercoat to the substrate to enable the construction of lightning arresters.

A still further object of this invention is to provide precise craters in the alumina undercoat to improve device planarity and pole-tips symmetry.

BRIEF DESCRIPTION OF THE DRAWINGS

FIGS. 3(a) to 3(h) are cross-sectional views, at various stages, during the patterning of thick alumina, such as used for the studless pads of the present invention.

FIG. 6 is a cross-sectional view showing the formation of a via in an alumina layer by a lift-off process.

DESCRIPTION OF THE PREFERRED EMBODIMENTS

Figure 1:
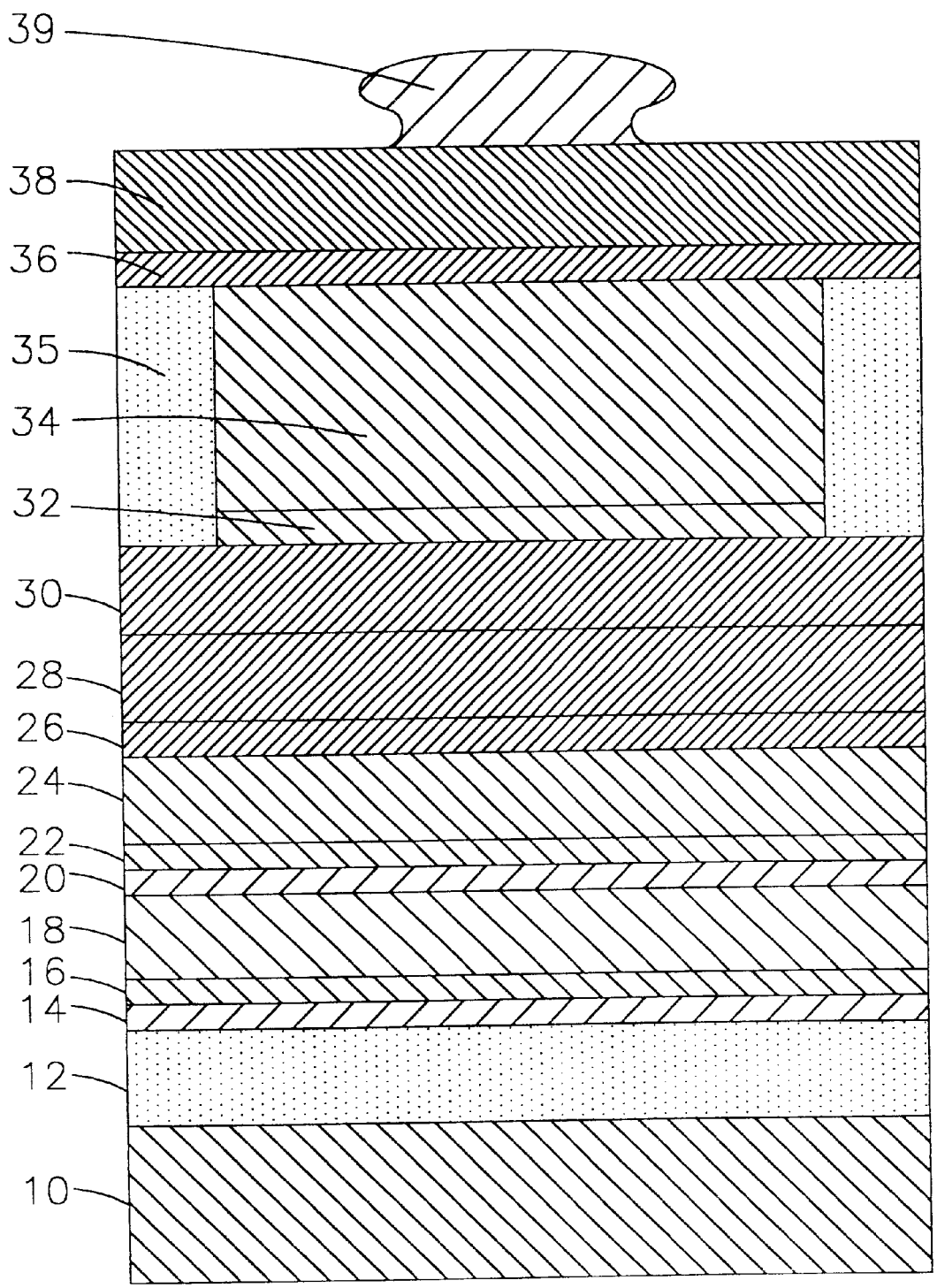
FIG. 1 shows a cross-section of a typical prior-art stud and bonding pad structure.

A schematic (not to scale) cross-section of a typical prior-art stud and bonding pad structure is shown in FIG. 1. An alumina undercoat 12 is first deposited over a ceramic substrate 10. The wafer is then subjected to the deposition and patterning of many layers. A typical succession of the metallic layers in the stud area may include a Cr (or Ti) seed-layer 14, a Cu seed-layer 16, a first level plated Cu coil 18, a Cr (or Ti) seed-layer 20, a Cu seed-layer 22, a second level plated coil 24, a Ni—Fe seed-layer 26 for the top pole, a first plated Ni—Fe layer 28 of the top pole, a second plated Ni—Fe layer 30, a Cu seed-layer 32 for the stud, a plated Cu stud 34, alumina overcoat 35, a Ni—Fe seed-layer 36 for the bonding pad, and a gold bonding pad 38. A wire 39 is bonded to gold bonding pad 38, typically by thermocompression or ultrasonic compression techniques. In some cases the stud structure may include other layers, such as a Ni—Fe seed-layer and plated layers of the bottom pole (between layers 12 and 14), or a Cr (or Ti) seed-layer under Cu seed-layer 32 for the stud, or under Ni—Fe seed-layer 36 for the bonding pad, or under Ni—Fe seed-layer 26 for the pole plating. In other cases, several of these layers are omitted. Typically the stud and bonding pad structure comprise about 10–15 individual metallic layers. In some cases, the bonding pad structure is placed on the alumina overcoat in a partial overlapping and staggering position relative to the stud structure. Bonding is made to the off-set portion of the pad to ensure adequate bonding strength. Such elaborate structures of the studs and bonding pads are susceptible to bonding failure due to the large number of metallic layers in the structure. In addition, the poor integrity of the alumina overcoat in the region surrounding the tall stud further impairs reliability and bonding strength.

Figure 2A:
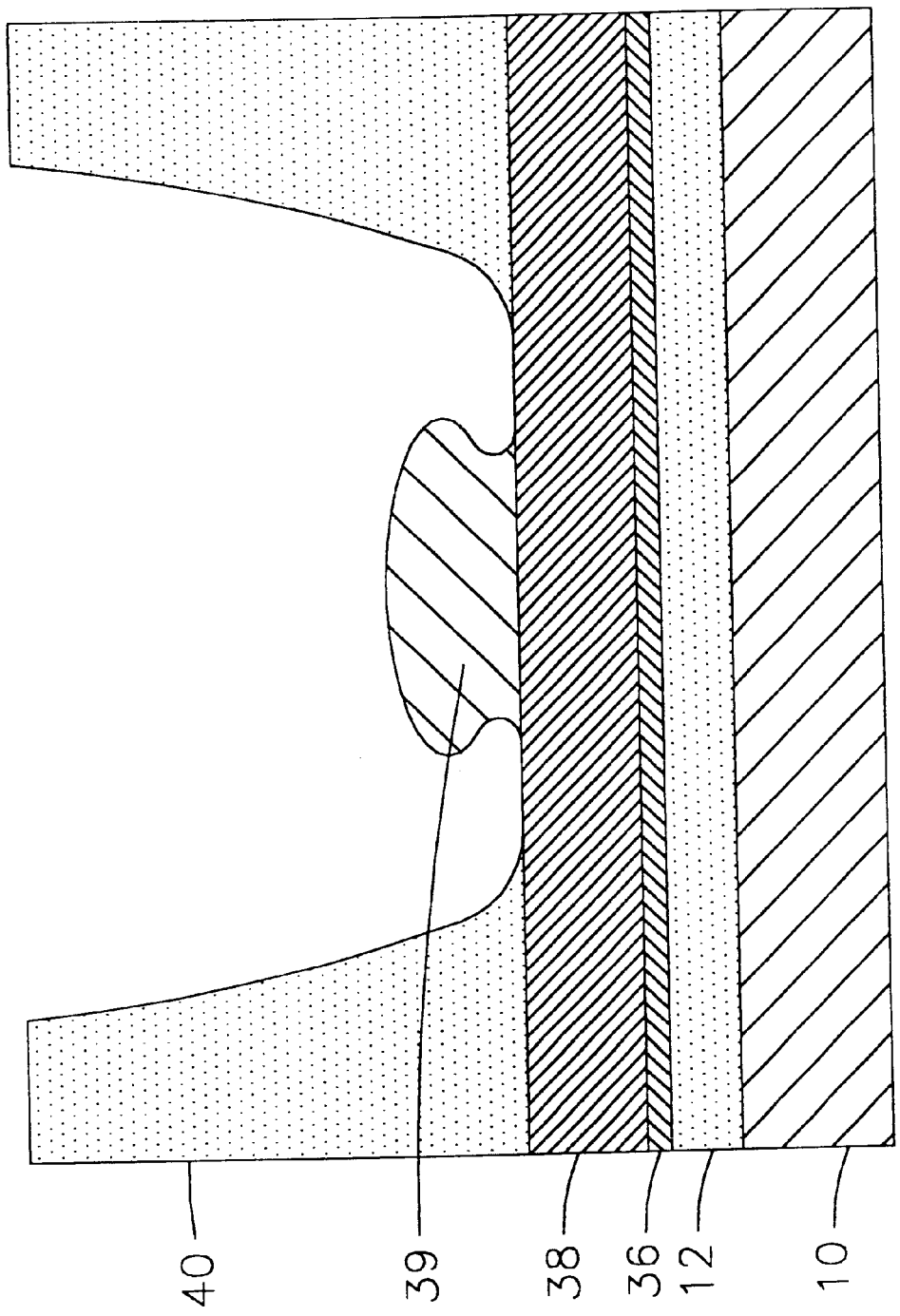
FIGS. 2(a) and 2(b) show cross-sections of alternative bonding pad structures embodying the present invention.

According to a preferred embodiment of this invention, the entire stud fabrication is eliminated, resulting in a simple bonding pad structure of only two metallic layers, shown in FIG. 2(a). A single seed-layer 36, such as Ni—Fe or W, is bonded to an alumina undercoat 12, which overlies a substrate 10. Seed layer 36 must be compatible for gold plating and must have good to moderate electrical conductivity and strong adhesion to alumina. Other metals and alloys suitable for this purpose include Mo, Ni—Co, Ni—Co—Fe, Cd, and In. The thickness of seed-layer 36 in FIG. 2(a) is in the range 600–2,000 Å, and preferably in the range 1,000–1,500 Å. This structure has only two metallic layers in the pad. An Au bonding pad 38 is preferably plated simultaneously with the coil turns and leads (not shown) through an appropriate photoresist mask. Both the coil and the bonding pads will then consist of the same (Au) metal. If the coil consists of more than a single level, different pads may be deposited and patterned simultaneously with different coil levels. Alternatively, one or more pads may be deposited and patterned repeatedly with more than one coil level. Such pads, however, will have more metallic layers in their structure. Following the coil/pad plating and stripping of the photoresist mask, seed-layer 36 must be removed from between the Au-plated areas. Using a different metal or alloy for seed-layer 36 from that used for pad 38 enables its removal by selective chemical etching, as described in U.S. Pat. No. 5,059,278 to Cohen et al., incorporated herein by reference. Wire 39 is bonded to the (Au) bonding pad 38 through the etched vias in the alumina overcoat 40.

Figure 2B:
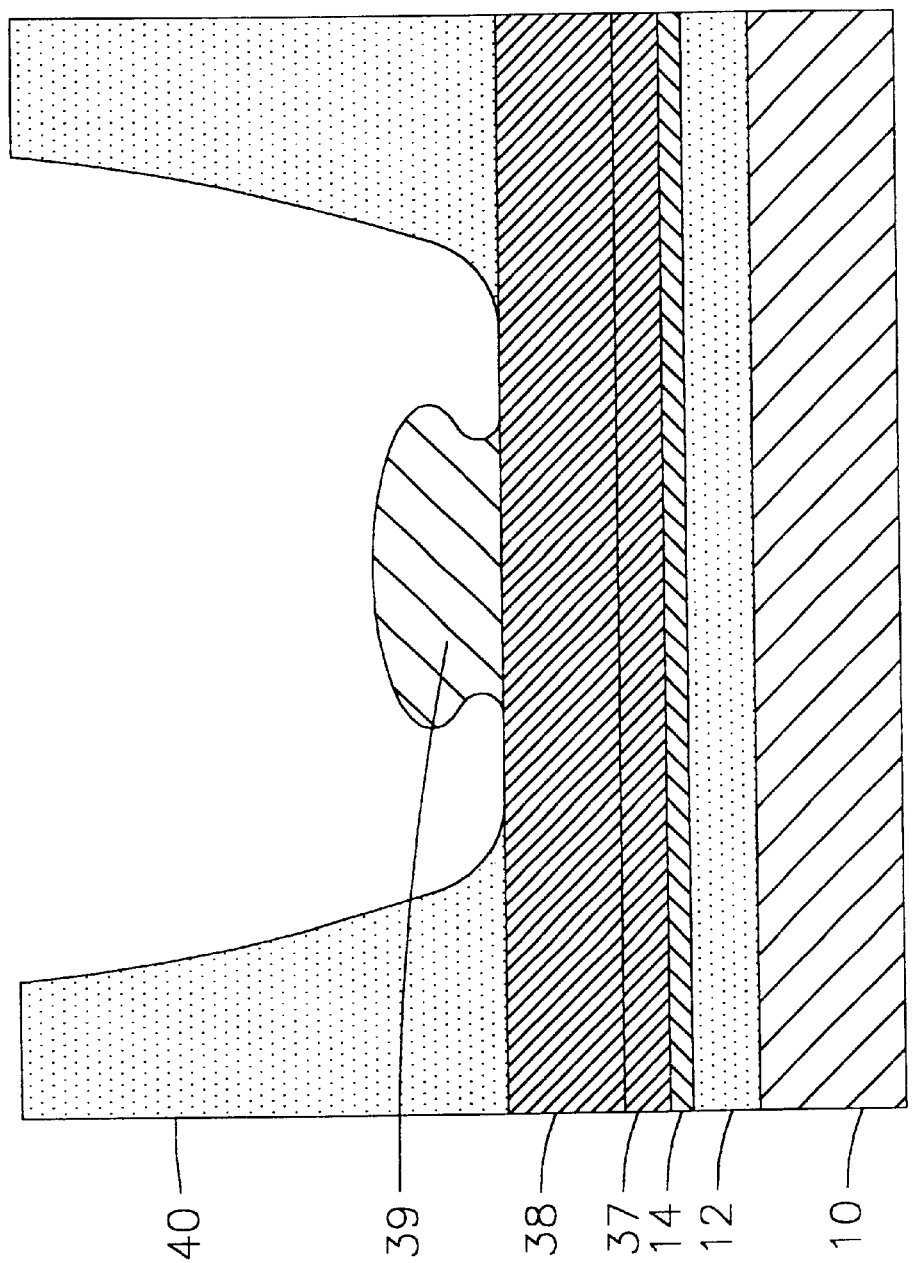

In another embodiment, the pad structure comprises a total of three or more metallic layers, as shown in FIG. 2(b). The structure combines at least two seed-layers. The first seed-layer comprises an adhesion layer 14 of Cr or Ti or another refractory metal such as W, Ta, Mo, Nb, V, Zr, and Hf, or an alloy comprising one or more of these metals. The function of this layer is to enhance adhesion between alumina and the following gold layer (gold alone has poor affinity to oxygen and, therefore, poor adhesion to alumina). The thickness of the adhesion seed-layer 14 can be in the range 50–500 Å, and preferably in the range 100–300 Å. The layer is usually deposited by a vacuum technique such as sputtering or evaporation. An Au seed-layer 37 is similarly deposited by sputtering or evaporation. It provides a low electrical resistance and compatible metallic surface for the plating of a gold pad 38. Other metals or alloys compatible with gold plating and having good electrical conductivity may also be used for the second metallic seed-layer 37. They include Ni—Fe, W, Mo, Cu, Ag, Pd, Pt, Rh, Ir, and alloys comprising one or more of these metals. In contrast, most refractory metals possess high electrical resistivity and are incompatible for gold plating. The thickness of the Au seed-layer 37 is in the range 500–3,000 Å, and preferably in the range 700–1,000 Å. Plated gold pad 38 has a thickness in the range 1.0–5.0 μm, and preferably in the range 2.0–4.0 μm. Again, the coil turns and leads and bonding pads may be plated simultaneously through a suitable photoresist mask. Alternatively, the coil may comprise gold or another highly conductive metal which is deposited and patterned separately from the bonding pad 38.

Other combinations may also be used. In particular, bonding pad 38 of FIGS. 2(a) and 2(b) may comprise Au, Cu, Ag, Pd, Pt, Rh, Ir, and alloys comprising one or more elements thereof. Usually the same layer is also used for the coil winding turns. Alternatively, the coil turns may comprise a different metal or alloy than the pad. For example, the coil turns may comprise Cu, Ag, Pd, Pt, Rh, Ir, and alloys comprising one or more elements thereof, while the bonding pad may comprise gold. However, different metals or alloys in the coil and pads require further processing steps, which add to manufacturing complexity and cost. It may be noted that although Al has both excellent conductivity and adhesion to alumina, it is incompatible for plating (of the coil). It is thus unsuitable as a seed-layer for any plating. However, Al as a single layer may be used simultaneously for both the coil and the bonding pad, if deposited by a vacuum technique (such as sputtering or evaporation) and patterned by etching. Appropriate etching techniques for Al patterning include ion milling and reactive ion etching (RIE). Wet etching of Al lacks the fine resolution required for the coil definition. When Al is used in this mode, seed-layer 36 of FIG. 2(a) and seed-layers 14 and 37 of FIG. 2(b) are eliminated, resulting in an even simpler structure. The noble metals Au, Cu, Ag, Pd, Pt, Rh, Ir, and alloys comprising one or more metals thereof may also be deposited as a continuous layer by plating or by a vacuum technique, and then pattern-etched simultaneously for both the coil turns and pads by ion milling or by RIE. The dry etching technique requires an appropriate etch mask combining both the coil and the pads patterns. It is formed over the top continuous metal layer. The remains of the etch mask are removed following the dry etching. Top layer noble metals require an intermediate adhesion layer similar to seed layer 36 in FIG. 2(a) and seed layer 14 in FIG. 2(b). Alternatively, the coil turns may comprise a different metal than the bonding pads and fabricated by different techniques. For example, the coil turns may comprise sputter or evaporation deposited Al and may be patterned by ion milling or RIE, while the bonding pads may consist of plated gold.

Patterning of thick alumina layers requires an etching mask which is substantially free of pores and not etched or adversely affected by the alumina etchant. When using dilute HF etchant for the alumina layer, etching masks based on photoresist alone are inadequate since they lift-off after only a short time in contact with the etchant. The dilute HF rapidly attacks the bond between the alumina and the photoresist. Metal masks must be used for the prolonged etching. The metal mask must have excellent adhesion to the alumina layer and it should be substantially free of pores. It must also be immune against attack by the etchant.

Figure 3A:
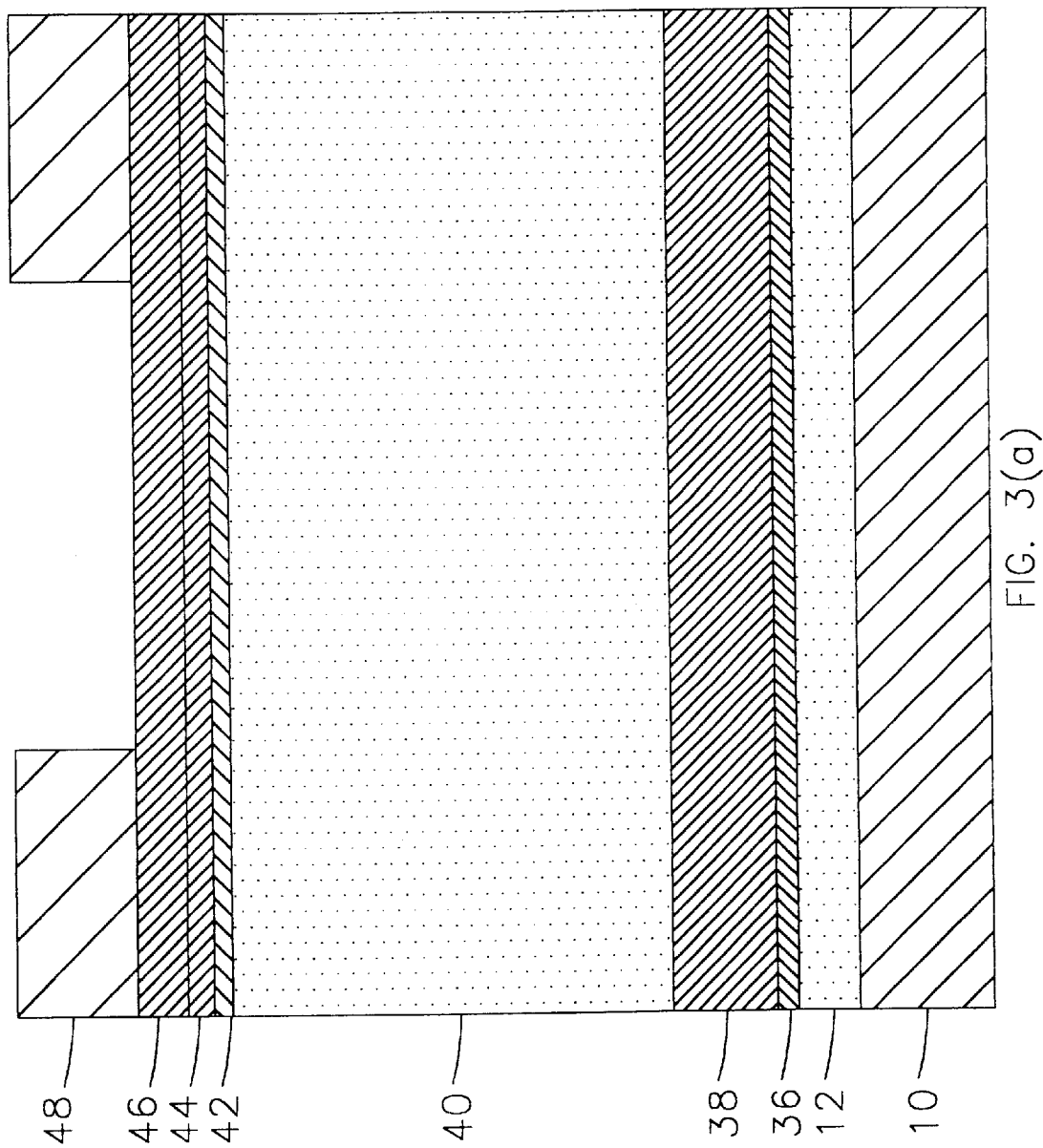

FIGS. 3(a) through 3(h) illustrate the major steps involved during the patterning of thick alumina, according to a preferred embodiment of this invention. FIG. 3(a) shows the structure after a photoresist layer 48 has been coated over the metallic mask layers and patterned by photolithography. Prior to coating the photoresist layer, successive seed-layers 42 of Cr or Ti and 44 of Au or Ni—Fe were deposited by a vacuum technique over a thick alumina layer 40. Seed-layer 42 must provide excellent adhesion to the alumina surface. It comprises a refractory metal from the group Cr, Ti, W, Ta, Mo, Nb, V, Zr, Hf, and alloys comprising one or more of these metals. The thickness of adhesion seed-layer 42 can be in the range 50–500 Å, and preferably in the range 100–300 Å. Since most refractory metals (such as Cr, Ti, Ta, Nb, V, Zr, and Hf) are incompatible for gold plating and have poor electrical conductivity, seed-layer 44, with good conductivity and compatibility for gold plating, is deposited over adhesion seed-layer 42. Gold is excellent for this purpose and is the preferred choice for seed-layer 44. However, it requires an expensive gold sputtering target. Alternatively, seed-layer 44 may comprise a metal from the group Ni—Fe, Ag, Pd, Pt, Rh, Ir, W, Mo, and alloys comprising one or more metals thereof. A single seed-layer 44 comprising Ni—Fe, W, Mo, or an alloy comprising one or more of these metals, possesses good adhesion and electrical conductivity and is compatible for gold plating. It can thus simplify the metallic mask by eliminating layer 42. The advantage of using Ni—Fe for seed-layer 44 is that it is already being utilized in the TFH fabrication process. The thickness of seed-layer 44 can be in the range 500–5,000 Å, and preferably in the range 700–1,500 Å. Usually vacuum deposition produces layers 42 and 44 which are quite porous and permeable and, therefore, inadequate for use alone as the metallic mask for thick-alumina etching.

After deposition of layers 42 and 44, the wafer is placed in a high purity (99.9%) "soft" gold plating bath, and a layer 46 of gold is plated over seed-layer 44. To ensure that plated gold layer 46 be free of pores, its thickness should exceed about 0.1–0.2 μm. Usually the thickness of layer 46 is in the range 0.1–1.0 μm, and preferably in the range 0.2–0.5 μm. Although it would be simpler to utilize Au seed-layer 44 alone, without the plated Au layer 46, sputter-deposited layers contain some pores even at thicknesses of more than 1.0 μm. Furthermore, thick (≧2 μm) sputter-deposited Au layers significantly increase the manufacturing cost due to the very expensive gold targets. Photoresist mask layer 48 is coated over the metallic mask layers and patterned by a regular photolithography technique.

Figure 3B:
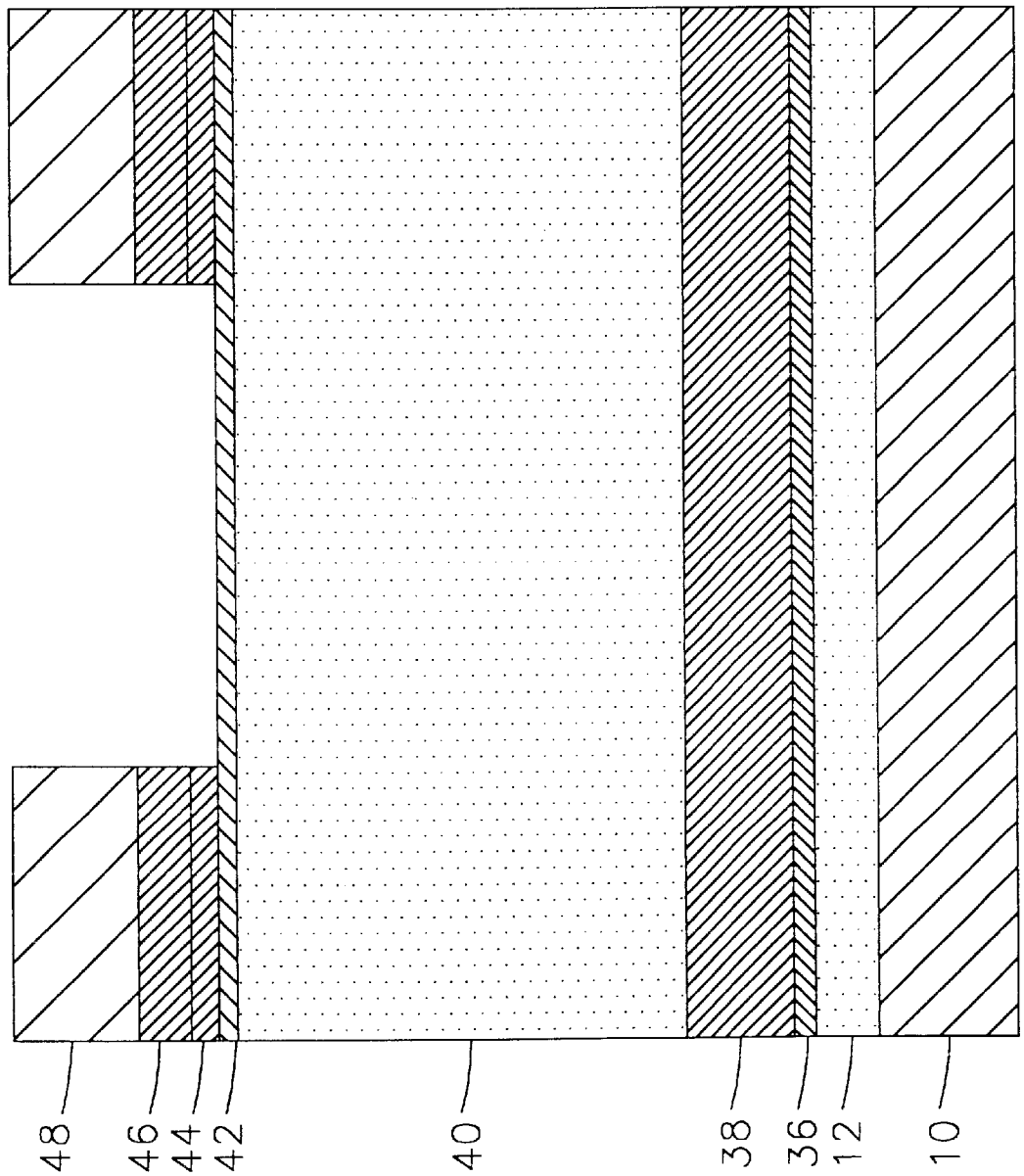

Next, the pattern is transferred to the metallic layers to form the etching mask. FIG. 3(b) shows the structure after pattern-etching gold layers 46 and 44 through the photoresist mask. A convenient etchant for the gold layers is based on a dilute solution of KI and I$_2$ in water:

| Potassium Iodide | KI | 100–200 g/l |
|---|---|---|
| Iodine | I$_2$ | 25–50 g/l |

This etchant is compatible with the positive photoresist mask. It takes about 1–2 minutes to etch Au layers 46 and 44 using this etchant at room temperature. It can be applied by immersion with moderate agitation, or by spraying. Lower concentrations and temperature decrease the etch rate, while higher concentrations and temperature increase it.

Following the pattern-etching of Au layers 46 and 44, the pattern has to be further transferred by etching to the Cr or Ti adhesion layer 42. First the photoresist layer 48 is removed using conventional stripping method, such as by dipping in or spraying with a commercial photoresist stripper, dilute KOH, or flood-light-exposure and developing. Next, using Au layers 46 and 44 as a mask, the wafer is placed in an appropriate selective etchant which only etches the Cr or Ti layer 42 but does not attack the Au mask. Alternatively, if the photoresist is compatible with the etchant, it may be left in place during the etching of layer 42 and then removed. An appropriate etchant for Cr in layer 42 consists of a basic potassium ferricyanide:

| Potassium Hydroxide | KOH | 50 g/l |
|---|---|---|
| Potassium Ferricyanide | K$_3$Fe(CN)$_6$ | 200 g/l |

This etchant is basic and, therefore, the (positive) photoresist mask is incompatible with it and must be removed prior to the etching. Using this etchant, it takes less than 1 minute to etch a Cr layer with thickness of 300 Å at room temperature. This etchant may also be applied by immersion or by spraying. The wafer is now ready for the deep alumina etch.

FIG. 3(c) shows the stage after etch-transfer through all the metallic layers and removal of the photoresist mask.

Figure 3D:
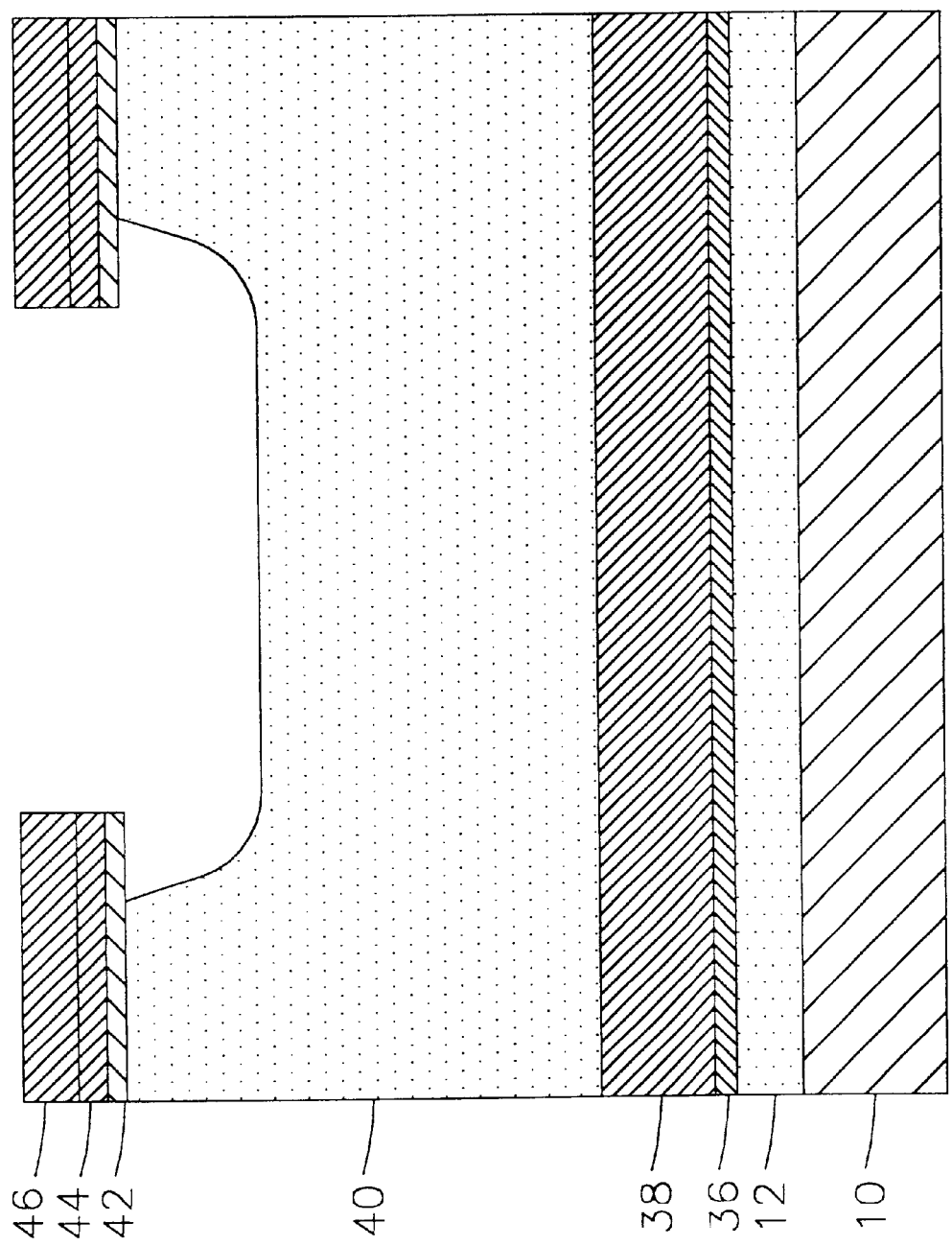

FIG. 3(d) shows the structure after partial etching through the thick alumina layer. An excellent etchant for alumina layer 40 is based on dilute (1:2) HF in water:

| Hydrofluoric Acid (48%) | HF | 1 volume |
| Water | $H_2O$ | 2 volumes |

This corresponds to an HF concentration by weight of 16%. The etchant is used by dipping with moderate agitation or by spraying. At room temperature the etch rate is about 1.0 $\mu$m/min. The etch rate is dependent on the quality, density, and integrity of the alumina layer. It is a function of sputter deposition parameters such as the substrate temperature, bias, gas pressure, power, and deposition rate. It is strongly affected by the local micro-topography and related alumina integrity. The etch rate of alumina of poor integrity in the vicinity of elevated features can be an order of magnitude faster than over a flat surface, far from the elevated features. Using the dilute HF (1:2) etchant, it was found that the etch rate across the wafer was highly uniform; $\sigma \leq 1\%$. This unusual etch uniformity is likely due to an interfacial kinetic control, as opposed to the more common mass transport control in most etching processes. The latter are sensitive to the degree of agitation, resulting in faster etching near edges and corners due to more vigorous agitation there. The interfacial reaction controlling the etching of alumina by dilute HF may involve the breaking of Al—O bonds in order to form soluble fluoride complex ions. The etch rate increases by raising the temperature or by using higher HF concentration. As the HF concentration decreases, the reaction kinetic becomes less interfacial controlled and more mass transport controlled. The operating temperature range can be 10–90° C., and preferably room temperature, for convenience. The etchant comprises HF and water in concentration range 10–100% v/v of concentrated (48%) HF, and preferably in the range 20–50% v/v of concentrated (48%) HF in water. The latter corresponds to a volume ratio range of 1:4–1:1 of (48%) HF and water and to a HF concentration in the range of 10% to 25% by weight. Other chemicals, such as alcohols or ethylene glycol, may also be added to or substituted for the water.

Other wet chemical etchants may also be used to pattern thick alumina layers. These may include hot phosphoric acid ($H_3PO_4$) and hot strong bases such as KOH, NaOH, $Ca(OH)_2$, and hot organic amines. In general, these etchants require relatively high concentrations and elevated temperatures to achieve reasonable etching rates, and they may lack the good uniformity of the HF-based etchant. Etch rates of the alternative etchants are sensitive to mass transport and therefore to agitation uniformity and to the aspect ratios of different features in the etch mask. Small features may etch slower than larger ones, leading to overetch of the latter. In general, the dry etching techniques, such as ion-milling or reactive ion etching (RIE), are too slow for etch-patterning thick alumina layers and are therefore impractical for this purpose.

Figure 3E:
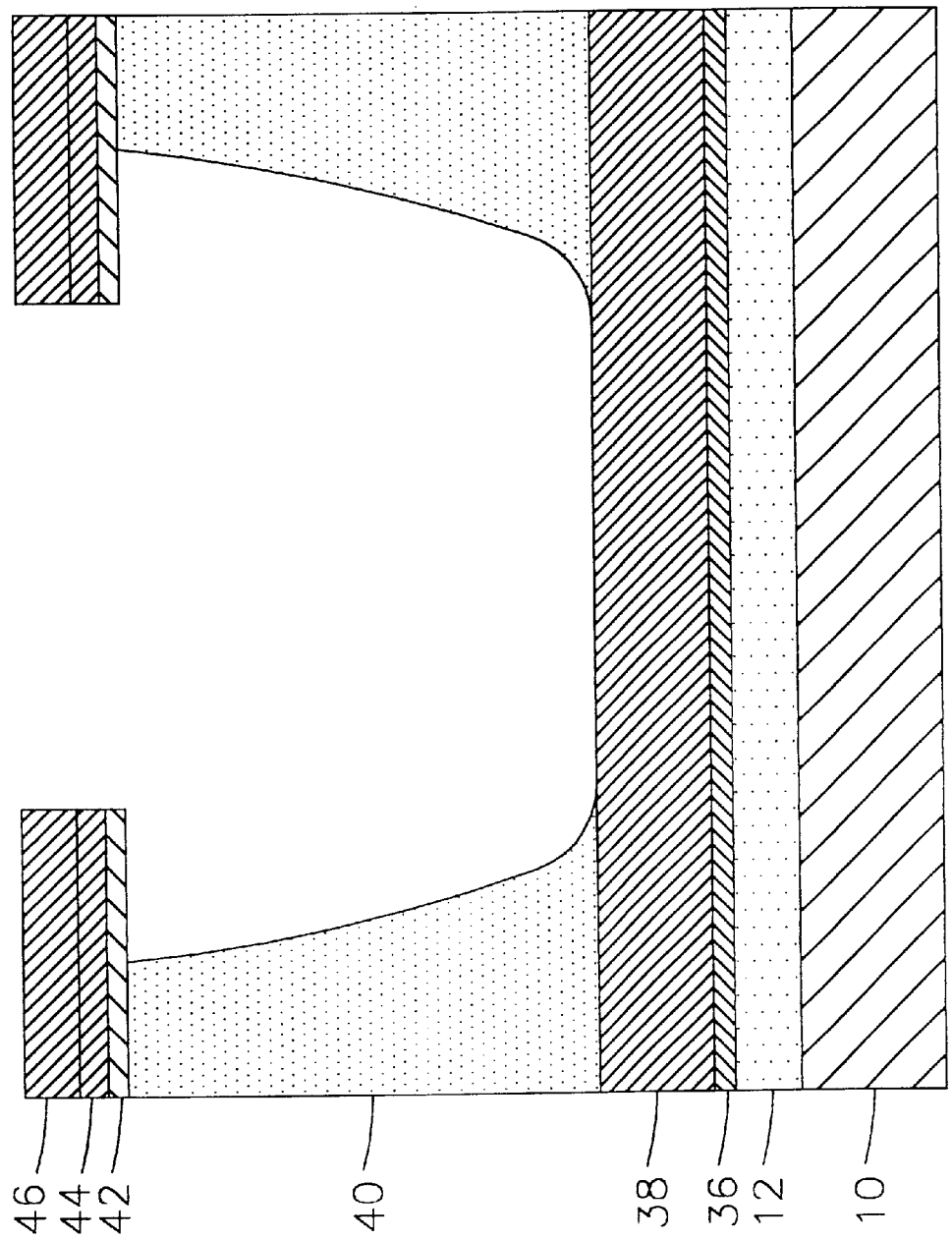
Figure 3F:
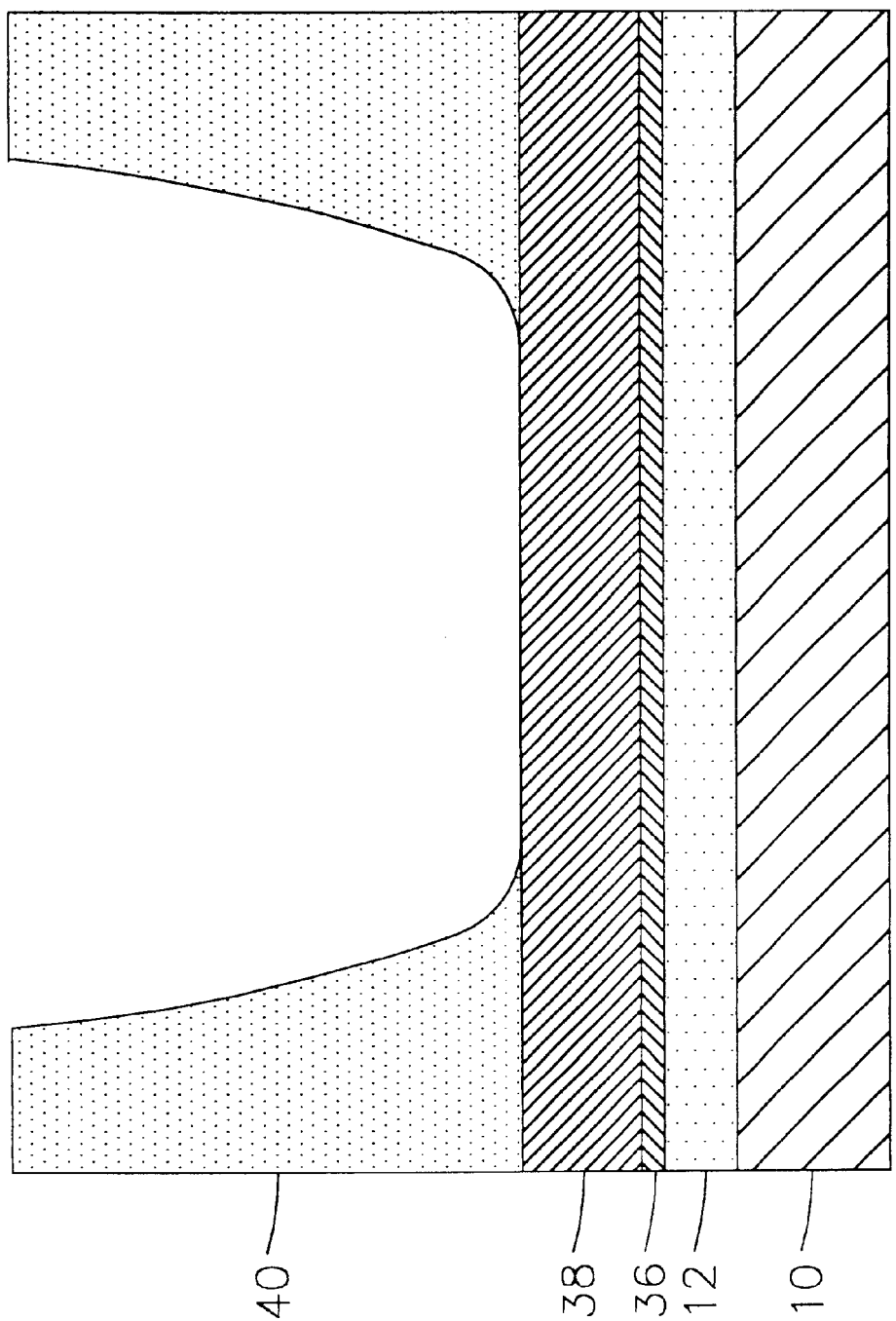

FIGS. 3(e) and 3(f) show the structure after completing the etching through the thick alumina layer 40 and after removal of the metallic mask layers, respectively. The Au bonding pad 38 serves as an etch stopper. The metallic mask layers are removed, in a reverse order of their deposition, by successive immersion or spraying first in a gold etchant (for layers 46 and 44) and then in a Cr (or Ti) etchant (for layer 42). Preferably, the metallic mask layers can be removed by sputter-etching or ion-milling. These etching techniques will also etch a similar thickness of the Au pad 38. As Au pad 38 is much thicker than the mask layers, the slight decrease in its thickness is usually not significant. Also, the initial thickness of pad 38 can be adjusted to compensate for this loss. Alternatively, a wet lift-off technique can be used, such as etching Cr layer 42 with an etchant based on acidic ceric ammonium sulfate (or nitrate) which rapidly attacks the bond between Cr layer 42 and alumina layer 40. This will cause the lift-off of the Au mask layers 44 and 46. An example of such an etchant is CR-14 manufactured by Cyantek Chemicals of Fremont, Calif.

Figure 3G:
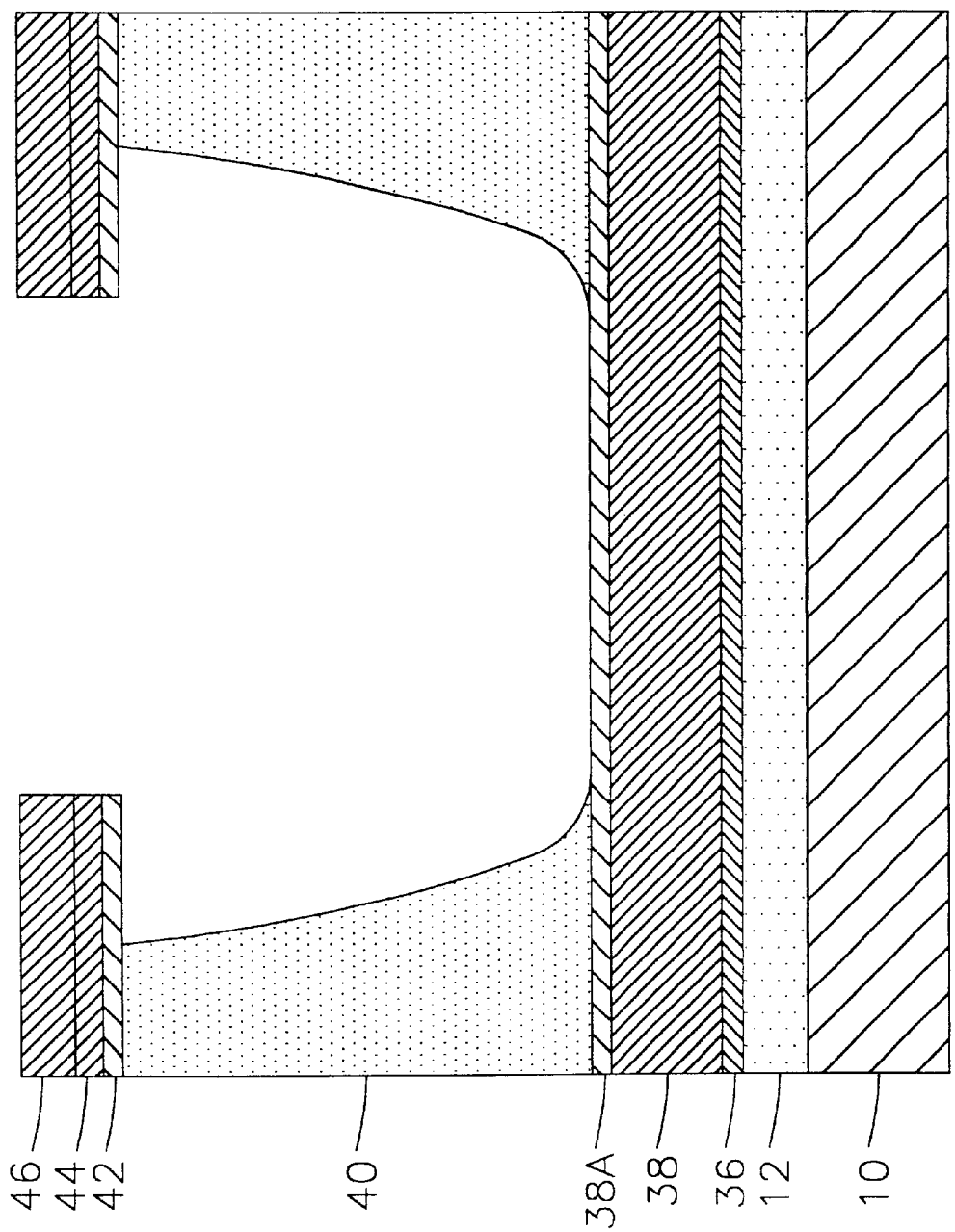
Figure 3H:
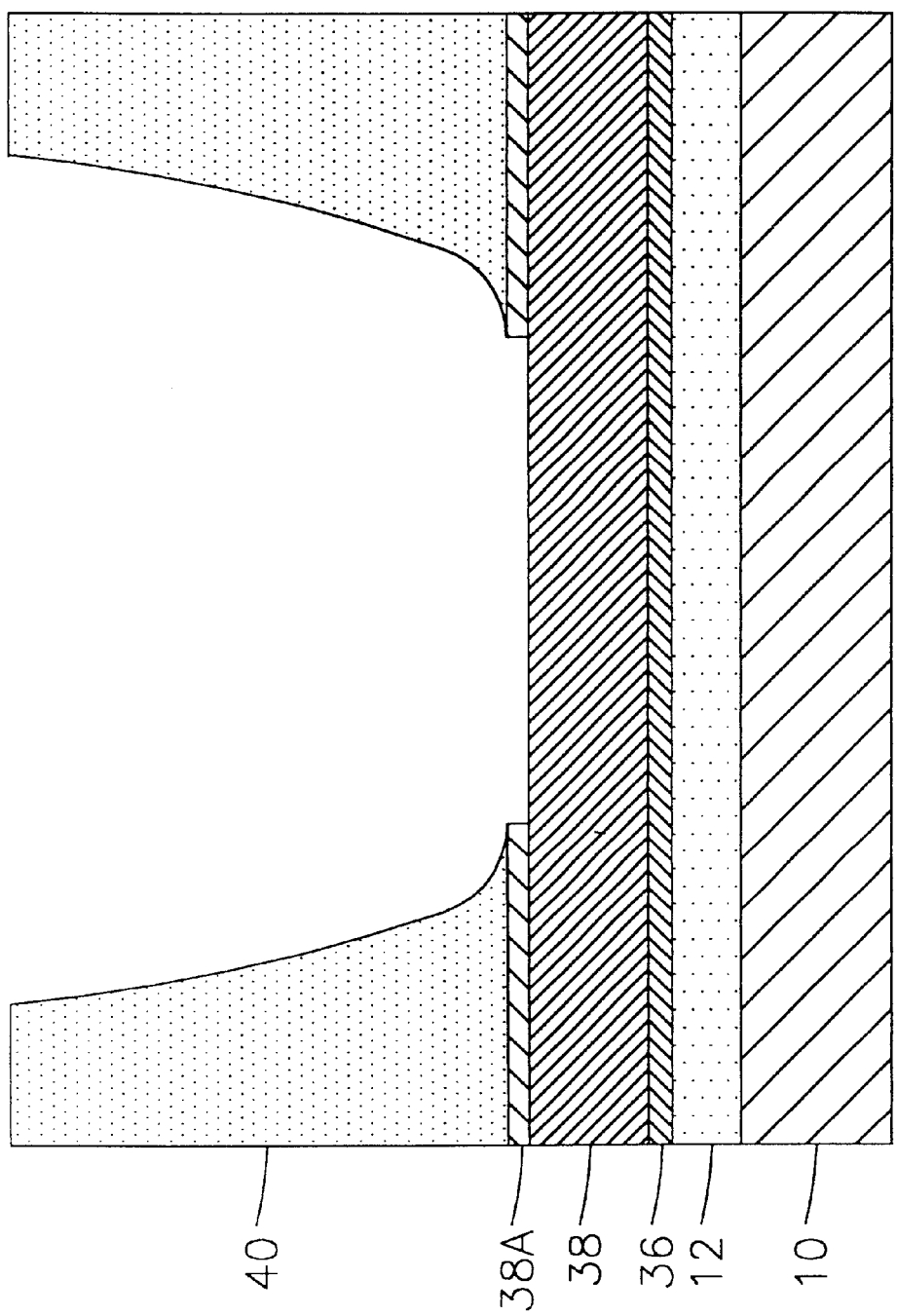

An alternative method to prevent etching of the Au pad 38 is to deposit and pattern an intermediate protective layer 38A of Cr (or Ti), as shown in FIG. 3(g), on top of the Au pad 38, prior to the deposition of alumina layer 40. The thickness of protective layer 38A is similar to that of layer 42 (about 100–300 Å for Cr or Ti). The intermediate layer 38A protects Au pad 38 during the wet etching of Au layers 46 and 44. Protective layer 38A offers the additional benefit of improved adhesion to the thick alumina layer 40. It is then removed from the via area during the wet etching of Cr (or Ti) layer 42, exposing Au pad 38 for subsequent bonding, as shown in FIG. 3(h). Protective layer 38A may also comprise a different metal or alloy than layer 42, such as plated or sputtered Ni—Fe. It can be etched by an appropriate selective etchant prior to or following the removal of layer 42. For example, layer 38A may consist of a 500–2,000 Å thick Ni—Fe layer plated immediately after the simultaneous plating of Au pad 38, using the same photoresist plating mask or another mask (exposing only the pad area). A selective etchant for this layer comprises nitric acid, phosphoric acid, and water in a volume ratio of 1:1:8, as described in U.S. Pat. No. 5,059,278.

As a part of the packaging process, after the wafer has been diced, a wire is bonded to Au bonding pad 38, typically by known thermocompression or ultrasonic compression techniques. A firm mechanical bond is then formed by surrounding the wire-pad bond with epoxy. The epoxy should preferably fill the via to the bonding pad so as to create an extremely strong mechanical bond between the wire and the TFH.

Alumina integrity in the region around the bonding pad vias is not impaired by the etching action. It is similar to regions of the alumina layer removed from the vias, since it was not deposited over elevated features. Furthermore, due to the elimination of the studs the required alumina overcoat thickness is significantly reduced. It incorporates less (integrated) stress, resulting in less chipping during machining, testing, and service, and the noise level is lowered. Further benefits of the reduced alumina overcoat thickness include improved yields and reliability and significantly higher throughput and lower cost.

Figure 4:
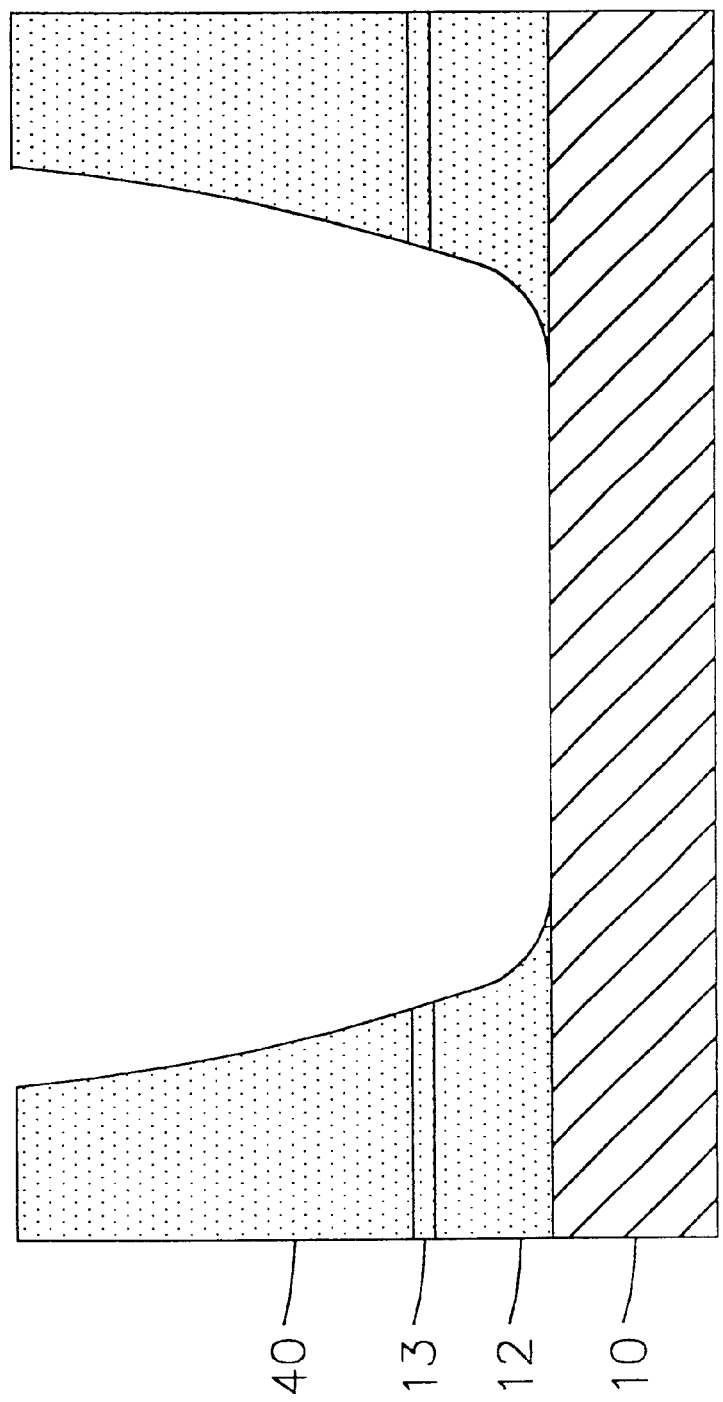
FIG. 4 is a cross-sectional view of a scribe-line groove after pattern-etching.

FIG. 4 shows a scribe-line groove etched through the combined alumina layers of overcoat 40, gap 13, and undercoat 12 using similar methods of etching through thick alumina, as described above. In this case the substrate 10 (usually comprising $Al_2O_3$—TiC) serves as the etch stopper. Removal of the sputter-deposited alumina in the wafer's streets and alleys grooves facilitates significant reduction of alumina chipping during the slider sawing and machining. The saw blade can be aligned precisely inside the grooves, without having to cut through the alumina layers, thereby maintaining alumina integrity and eliminating its chipping due to mechanical stress and damage. The etched scribe-line grooves also assist less wobble of the saw blade, preserving narrow cut lines and minimizing kerf. The scribe-line grooves can be etched during the same operation of etching the bonding pad vias, as described above. However, the combined groove and pad via mask pattern must be properly designed with smaller pad via openings to compensate for the lateral expansion during the extra etching time of the gap and undercoat layers. The combined etching of the bonding pad vias and scribe-lines has the further benefits of significantly reduced alumina overcoat layer thickness, shorter etch time, better resolution, improved alumina integrity (lower integrated stress and elimination of elevated features), improved yields and reliability, higher throughput, and lower cost.

Figure 5:
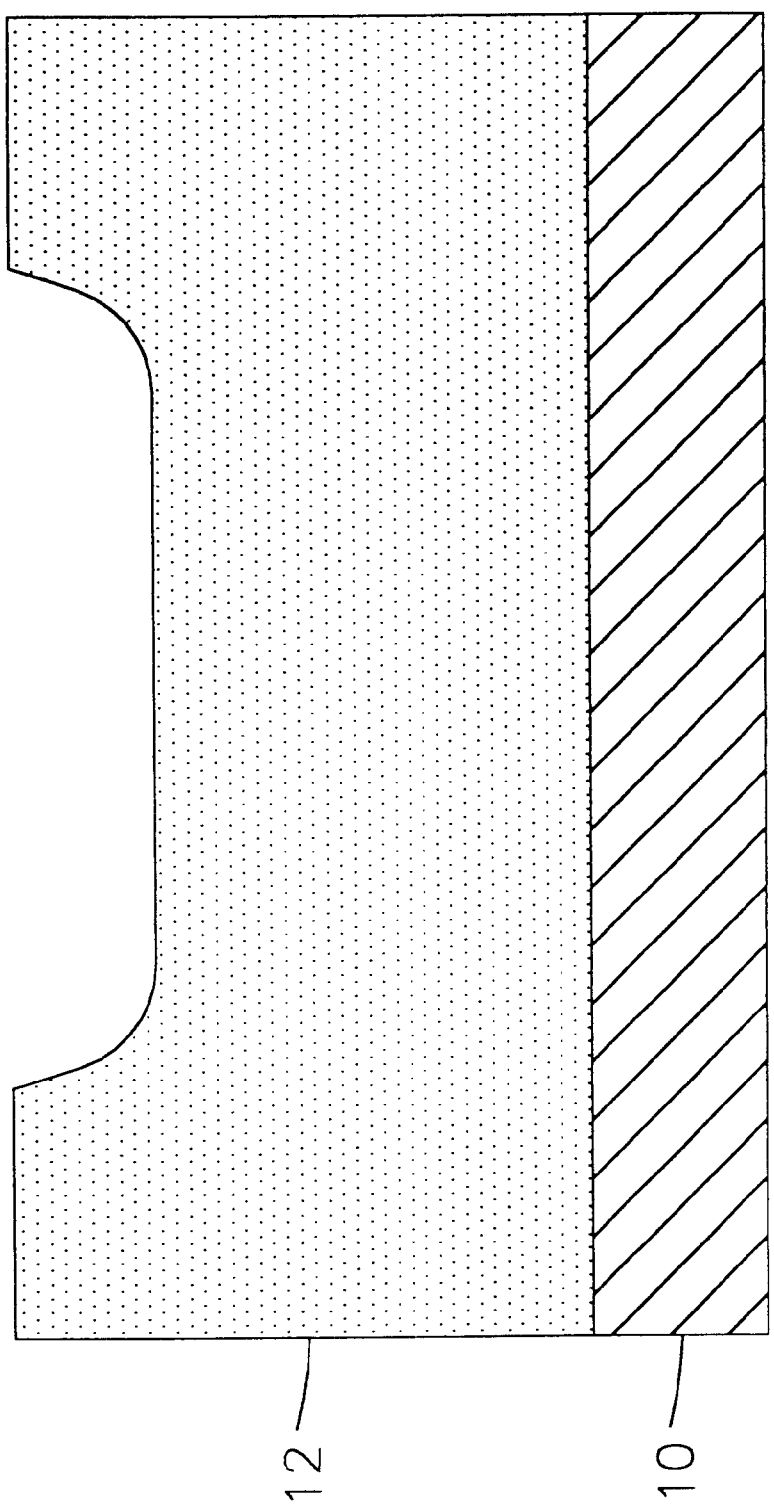
FIG. 5 is a cross-sectional view of a recessed crater after pattern-etching.

FIG. 5 shows a recessed crater formed in the alumina undercoat layer 12, using methods of etching through thick alumina similar to those described above. The crater depth can be controlled by removing the wafer from the etchant at any time before undercoat 12 has been etched through, or by placing an etch-stopper layer at the required depth. The etch-stopper may comprise a pore-free compatible metallic layer, cured photoresist layer, or the substrate itself. Due to the very uniform etch rate across the wafer, the craters are of very uniform depth. Alumina integrity in the vicinity and around the craters is not impaired by the etching action. It is similar to the bulk of the alumina layer far removed from the craters. Such craters can be used to fabricate in them at least a portion of the bottom magnetic pole, for example, in order to improve total device planarity and symmetry. Other device features or layers can also be fabricated inside such craters. These may include at least portions of the gap, one or more levels of insulation and/or coil layers or the metallic bonding pads.

Lightning arresters can be constructed by etching vias through the alumina undercoat to expose the substrate and then electrically connecting the magnetic core to the substrate. Electrical connection between the magnetic core and the substrate is established by depositing and patterning a metallic layer through the vias following the alumina vias etching. Alternatively, a metallic layer may be deposited and patterned over the substrate prior to the deposition of the alumina undercoat. This metallic layer serves as the etch-stopper during the etching of the alumina vias. The metallic layer is connected through the vias to the magnetic core following the etching of the alumina vias, to insure good electrical contact between the magnetic core and the lightning arrester. Grounding the magnetic core electrically prevents arcing between the head and a rotating disk. The magnetic core is grounded by connecting it to the grounded substrate. The lightning arrester can be deposited and patterned either as part of the deposition of one of the magnetic poles, or it can be constructed as a separate layer preceding or following the deposition of either the bottom or the top magnetic pole. In other embodiments, thick alumina layers can be patterned by non-etching techniques. One such alternative includes forming thick "plugs" over the bonding pads prior to the deposition of the alumina layer. The plugs may comprise photoresist or a selectively etchable metal. Following the deposition of the alumina layer, the wafer is lapped-down to expose the plugs, which are then removed by selective etching (or stripping). The technique requires the full thickness of the alumina overcoat, and it may produce inferior alumina integrity in the vicinity of the vias. Also, when using photoresist plugs, if the heat removal is inadequate during the alumina deposition, the photoresist may contaminate the sputtering system, or the plugs may bake beyond stripping. Other alternative non-etching methods to produce thick alumina layer patterning, or vias, include various "lift-off" techniques. Such techniques require forming plugs with negative-slope walls prior to the deposition of the alumina layer. FIG. 6 shows a plug 50 having negative-slope walls 52 formed on a bonding pad 38. When alumina layer 40 is sputtered, a cap 40A is formed on top of plug 50. Because the sputtering process is highly directional and anisotropic, the overhang created by negative-sloped walls 52 leaves a gap between the lateral termination of alumina layer 40 and plug 50. Plug 50 is then selectively etched (or stripped, if it consists of photoresist), thereby "lifting off" cap 40A and leaving a via in alumina layer 40.

Lift-off methods may use, for example, (negative) photoresist plugs with negative-slope walls or selectively etchable metal plugs with negative-slope walls. The negative-slope walls of the plugs are required in order to provide accessibility of the liquid etchant (or stripper) to the plugs. For the same reason, the plugs must not be completely buried by the surrounding alumina layer. This implies that the plugs must be thicker than the deposited alumina layer.

Photoresist plugs having the negative-slope walls can be produced by using a negative photoresist (or a positive photoresist with tone-reversal process). Alternatively, stacking two or more photoresist layers wherein the bottom photoresist layer is faster (more sensitive) and/or develops faster than the top photoresist layer, can produce negative-slope walls. Metal plugs with negative-slope walls can be produced by plating the metal through a positive photoresist mask and then stripping off the mask. The natural positive-slope wall profile of the positive photoresist mold mask produces a negative-slope wall profile of the plated metal plugs. Also, the metal plugs can be plated to a thickness well beyond the thickness of the photoresist mask, thereby causing the plugs to spread laterally (mushroom) over the photoresist mask.

The lift-off methods generally require more processing steps than the etching methods and also may result in inferior alumina integrity in the vicinity of the vias. However, the lift-off methods offer the possibility of using a thinner alumina overcoat than is necessary for conventional studs.

Figure 7A:
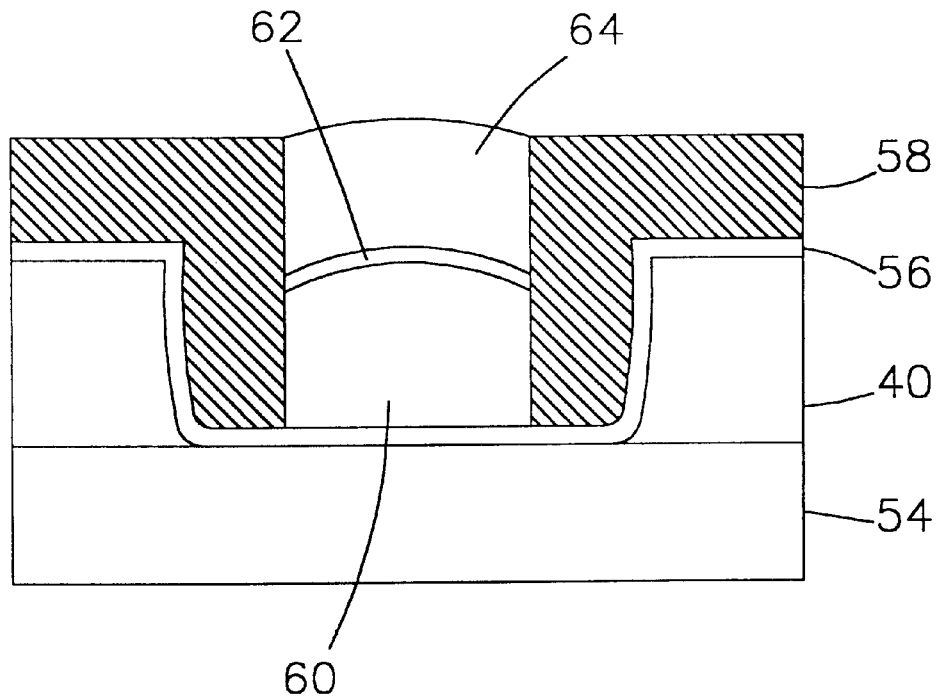
FIGS. 7(a) and 7(b) are cross-sectional views showing two ways in which a photoresist layer can be patterned to form a stud within a via.
Figure 7B:
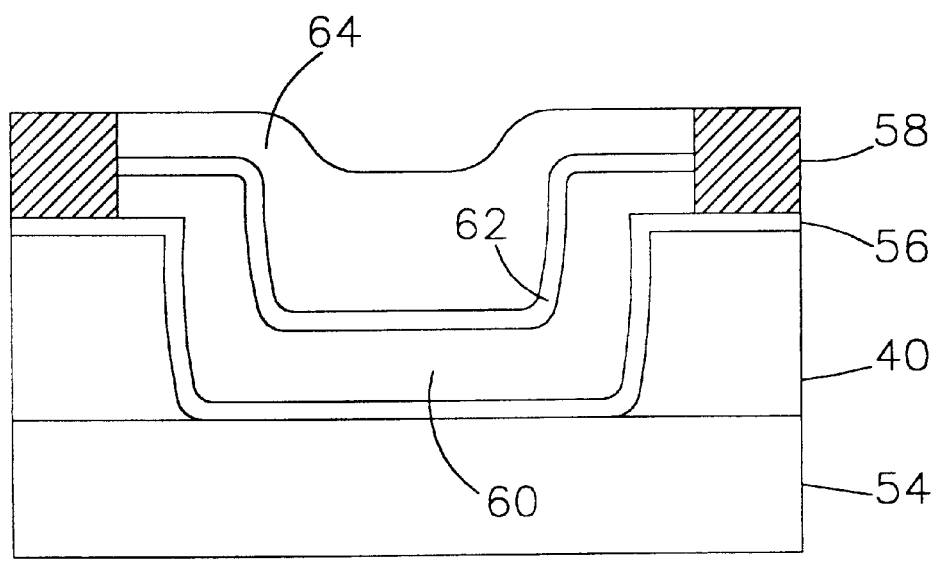
Figure 8A:
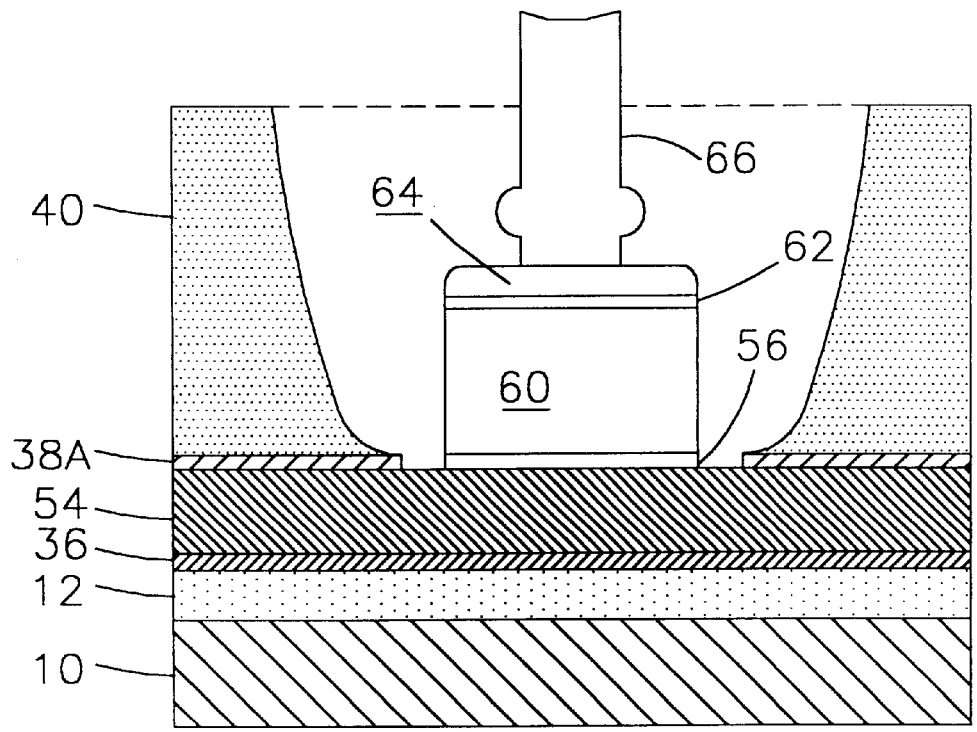
FIG. 8(a) is a cross-sectional view showing a stud and a bonding pad which extend partially through a via in an alumina layer.
Figure 8B:
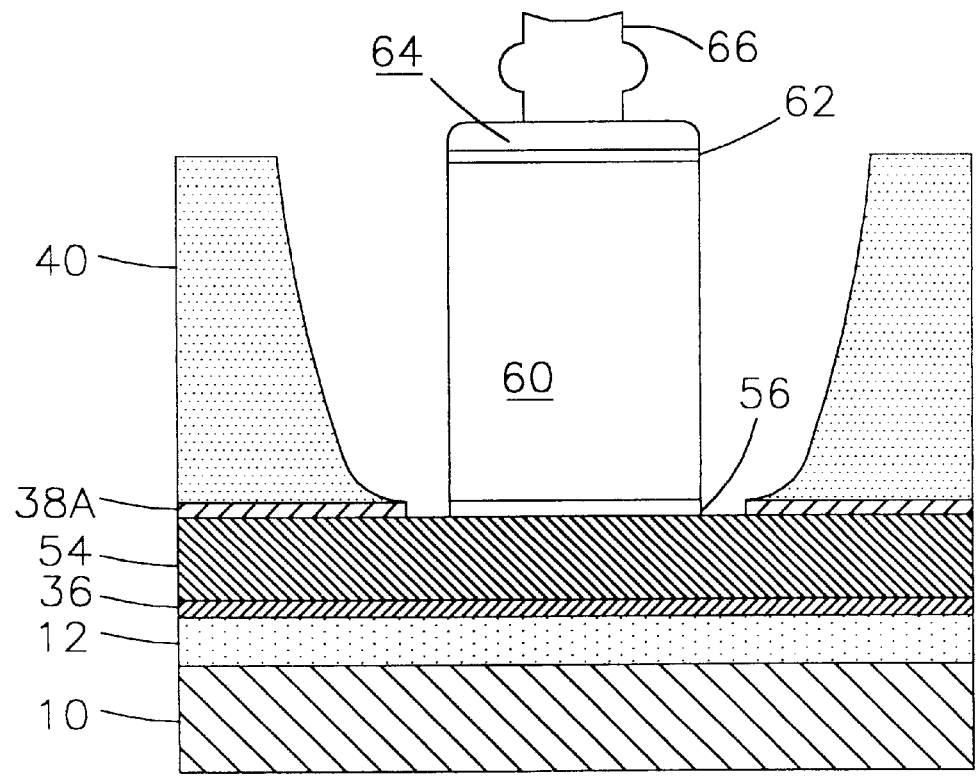
FIG. 8(b) is a cross-sectional view showing a stud and a bonding pad which extend all the way through a via in an alumina layer.
Figure 8C:
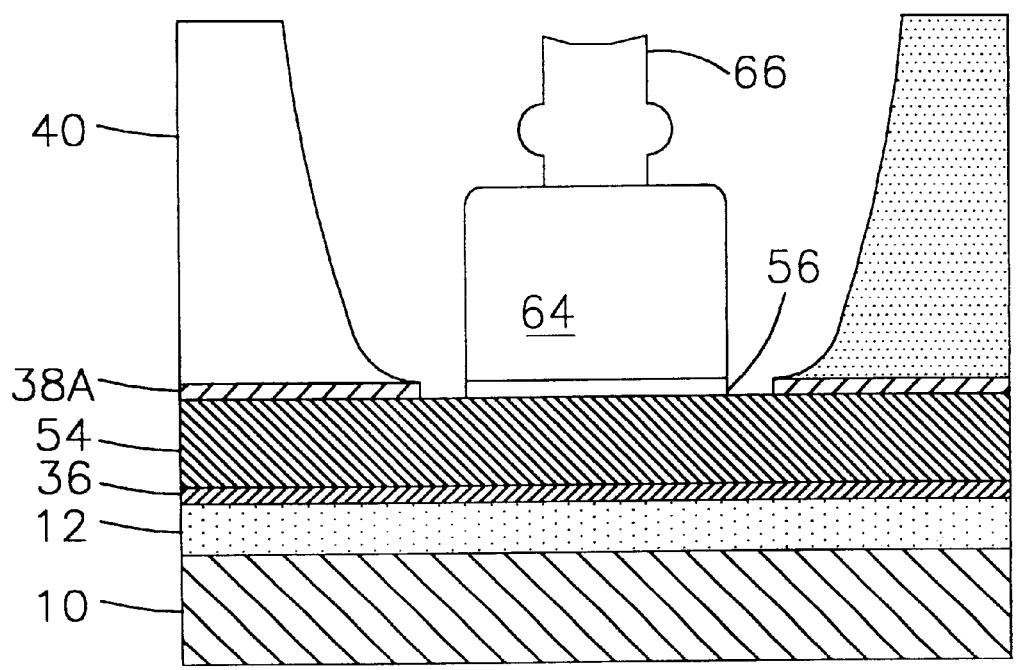
FIG. 8(c) is a cross-sectional view showing a bonding pad which extends partially through a via in an alumina layer.
Figure 8D:
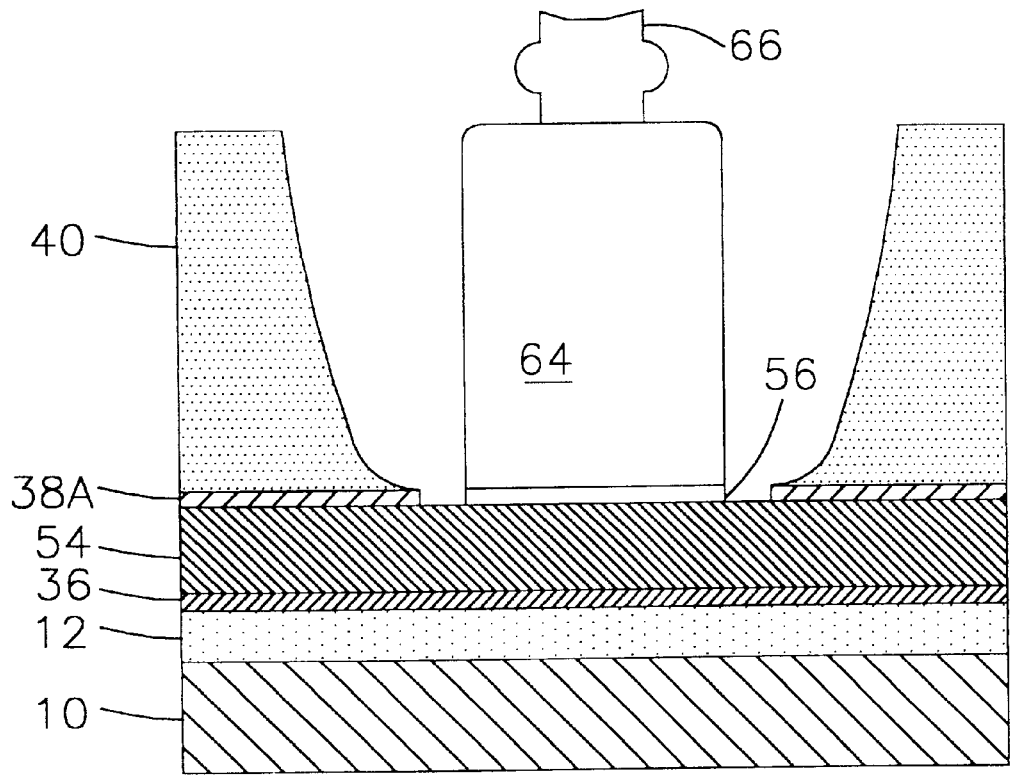
FIG. 8(d) is a cross-sectional view showing a bonding pad which extends all the way through a via in an alumina layer.

In another embodiment, vias in the alumina overcoat are combined with studs which partially or completely fill the vias. The studs may be confined laterally to the central portion of the via, as shown in FIG. 7(a), or they may extend laterally to the sides of the via and beyond, as shown in FIG. 7(b). In both cases, after the via is formed, as described above, a seed or adhesion layer 56 is deposited on the exposed surfaces of the coil lead 54 and the alumina layer 40. A photoresist layer 58 is then deposited. In the embodiment of FIG. 7(a), photoresist layer 58 is photolithographically patterned such that it extends into the via, whereas in the embodiment of FIG. 7(b) it is patterned such that it is held back from the sides of the via. A metallic stud 60 is plated on the seed layer 56, and optionally a second seed layer 62 is deposited on the stud 60. A bonding pad 64 is then deposited on the seed layer 62. It will be evident that there are many possible embodiments between those shown in FIGS. 7(a) and 7(b), with the stud having various widths. The embodiment of FIG. 7(a) is preferred, however, and will be used in the discussion which follows.

Various versions of the combination vias-studs technique are illustrated in FIGS. 8(a)–8(d). In the embodiments shown in FIGS. 8(a) and 8(b), a via is first formed in the alumina overcoat 40 to expose the coil lead 54, a metallic stud 60 is plated inside the via, and finally a bonding pad 64 is formed over the stud 60. A wire 66 is bonded to the bonding pad 64. Seed layers 56 and 62 may be required between the coil lead 54 and metallic stud 60, and between the metallic stud 60 and bonding pad 64, respectively. In FIG. 8(*a*), the stud 60 extends part of the distance between the coil lead 54 and the plane of the surface of the alumina overcoat 40 (shown by the dashed line), whereas in FIG. 8(*b*) the stud extends all the way to the plane of the surface of the alumina overcoat, and in other embodiments it could extend above the plane of the surface.

Alternatively, as shown in FIGS. 8(*c*) and 8(*d*), the bonding pad 64 can be plated directly over the coil lead 54 (or over seed layer 56) at the bottom of the via to any required thickness without a separate stud plating, in which case the bonding pad serves in essence as both a bonding pad and as a partial- or full-height stud inside the via. In FIG. 8(*c*), the bonding pad 64 extends part of the distance between the coil lead 54 and the plane of the surface of the alumina overcoat 40, whereas in FIG. 8(*c*) the bonding pad 64 extends all the way to the plane of the surface of the alumina overcoat, and in other embodiments it could extend above the plane of the surface.

The combination vias-studs scheme may alleviate problems arising from the dimensions of the wire bonding tool tip, since in the studless structure the bonding tool tip must readily fit inside the vias. This may be particularly important for very small form TFH devices, where the dimensions of the bonding pads and vias must be minimized. Like the studless version, the combination method may utilize a relatively thin alumina overcoat and, provided that the alumina vias are formed by etching, the combination method can also provide good alumina integrity surrounding the vias. In general, however, methods which use a combination of vias and studs require significantly more processing and photomasking steps then the studless method.

EXAMPLES

Example 1

Bonding pad vias were etched through the alumina overcoat Using a metallic etch mask similar to the one shown in FIG. 3(*a*). The Au pad 38 was 3.2 $\mu$m thick and the alumina overcoat 40 was about 35 $\mu$m thick. A 300 Å thick Cr seed-layer 42 was sputter deposited over the alumina layer 40. This was immediately followed by sputtering a 1,000 Å thick Au seed-layer 44. The wafer was then placed in a high purity "soft" gold plating bath (PAG 401, by Sel Rex) and was plated with a 5,000 Å thick gold layer 46. A positive photoresist layer 48 was then coated, exposed and patterned with the pad areas opened, by a regular photolithographic process. The wafer was then placed in a gold etchant comprising KI (200 g/l), $I_2$ (50 g/l), and pure water. Etching was done at room temperature by immersion with moderate agitation. Inspection after 60 seconds etching revealed that the gold was cleared in the via areas, as shown in FIG. 3(*b*). An extra etching time of 30 seconds was used to ensure complete Au etching everywhere. Photoresist mask 48 was then removed using successive immersions in hot and cold acetone with moderate agitation. The thickness of the Au layer across the wafer was measured with a Dektak surface profilometer. Next, the Cr seed-layer 42 was pattern-etched using the gold layers 44 and 46 as etch mask. The etchant comprised KOH (50 g/l), $K_3Fe(CN)_6$ (200 g/l), and pure water. Etching was carried out by immersion with moderate agitation at room temperature. Inspection after 35 seconds of etching revealed that the Cr was cleared in the via areas, as shown in FIG. 3(*c*). An extra etching time of 90 seconds was used to ensure complete etching. This completed the pattern transfer to the metal mask. The wafer was then immersed with moderate agitation in dilute HF (1:2) in water at room temperature to etch the alumina layer 40. Etching was interrupted after a partial etching of 30 minutes, as shown in FIG. 3(*d*). The partially etched alumina step height was measured across the wafer (in exactly the same spots as after the Au mask etching) with a Dektak surface profilometer. The total step variation from the center (29.49 $\mu$m) to the edge of the wafer (29.69 $\mu$m) was only 0.20 $\mu$m, corresponding to $\sigma=0.48\%$. Alumina etching was then resumed for another 7 minutes. At that time, the Au pad 38 was exposed, as shown in FIG. 3(*e*). Next the Au mask layers 46 and 44 were removed by etching in the iodine/iodide Au etchant for 60 seconds. The wafer was then rinsed and placed in the Cr etchant for 2.0 minutes to remove the Cr seed-layer 42. This completed the pattern-etching of deep vias through the alumina overcoat to the gold bonding pad, as shown in FIG. 3(*f*). No pin-holes or other defects were seen in the protected areas, and line definition was excellent.

Example 2

The configuration and etching procedures were used as in Example 1, except that the plated Au layer 46 was only about 0.2 $\mu$m thick. Also, a single sputter-etching step was used to remove all the metallic mask layers after completion of the alumina etching. Again, even with the thinner Au mask layer, no pin-holes or other defects were observed in the protected areas and line definition was excellent.

The wafers of Examples 1 and 2 were tested for bonding strength. Gold plated Cu wires were bonded through the alumina vias to the gold pads. Bonding tool alignment (to the pads) and whipping were greatly eased by the vias. The bonding strength of these studless devices was compared by a pull-test against regularly fabricated devices with thick copper studs. The studless devices exhibited excellent bonding strength, over 65 grams force in the pull-test. In all tests of the studless devices the applied force was either the maximum deliverable by the tester, or failures were attributable to wire breaking. For comparison, the regular devices with studs exhibited failures at about 28–35 grams force, with failures often due to bond breaking.

Example 3

Scribe-line grooves were etched through the alumina overcoat, gap, and undercoat layers using a metallic etch mask similar to that used in Examples 1 and 2, but with a sputtered 1,000 Å thick Ni—Fe seed-layer (44 in FIG. 3(*a*)) instead of an Au seed-layer. Also, the substrate 10 itself served as the alumina etch stopper, see FIG. 4. The thickness of the combined alumina layers was about 55 $\mu$m, and the plated Au layer 46 was about 5,000 Å thick. Following the pattern etch of the Au layer 46 (as in Examples 1 and 2), the Ni—Fe seed-layer was pattern-etched by an etchant comprising 1 volume of (concentrated) nitric acid, 1 volume of (concentrated) phosphoric acid, and 8 volumes of pure water, as described in U.S. Pat. No. 5,059,278. Etching was done by immersion with moderate agitation and at room temperature. Etching duration was 4.0 minutes to ensure complete clearing of the Ni—Fe in the groove areas. The photoresist mask 48 was then removed by dipping in a 5% (w/o) KOH solution in water, at room temperature and with moderate agitation. Next the Cr seed-layer 42 was pattern-etched as in Examples 1 and 2. The thickness of the combined metallic mask layers was then measured across the wafer by a Dektak profilometer. The combined alumina layers were then etched in the dilute HF (1:2) etchant, similar to Examples 1 and 2. Alumina etching was interrupted after 50 minutes, and the step height was measured by a Dektak profilometer across the wafer (in exactly the same spots as after the etching of the Cr mask layer). The total step variation from the center of the wafer (49.59 μm) to the edge of the wafer (49.98 μm) was only 0.40 μm, corresponding to σ=0.55%. The wafer was then replaced in the alumina etchant for 5 more minutes and the step height measured again in the same locations. This time the center measured 52.45 μm, but the edge measured 55.30 μm; the variation being 2.85 μm. The large variation this time was due to non-uniform thickness of the alumina layers. Etching was complete through the alumina thickness in the center, but was not complete near the edge of the wafer due to thicker alumina there. This was further verified by resuming the alumina etching for another 5 minutes (for a total of 60 minutes). This time the total variation from the center (52.45 μm) to the edge of the wafer (56.31 μm) was 3.86 μm (σ=5.02%). There was no increase in the step height in the center and only a small increase near the edge, indicating that etching was almost complete after 55 minutes. In a microscopic inspection it was also noticed that after 55 minutes etch, areas near the wafer edge showed rainbow interference colors. These did not appear at the center of the wafers. The rainbow colors are indicative of the presence of some alumina residue of varying thickness. The rainbow interference colors disappeared from areas near the edge after 60 minutes etch. The deep alumina etching technique, combined with step height measurements, provides a convenient and precise method for evaluating the thickness of the alumina layers across a wafer. The metallic mask layers were then removed by sputter etching. Once again, no pin-holes or other defects were detected and line definition was excellent. This is remarkable, considering that the thickness of the etched alumina layer was about 55 μm.

The wafer with the etched streets and alleys scribe line grooves was sawed and machined into regular rows and sliders using the grooves as guides for the saw blade. Alumina chipping was compared against regular wafers without the scribe-line grooves. The latter showed significantly more alumina chipping than the first. The wafer with the etched alumina grooves displayed clean cuts with no detectable alumina chipping.

Example 4

Several other combinations of metallic layers, already in use in the manufacture of thin film heads, were tried as masks for etching thick alumina layers.

They included the following:

(a) A 300 Å thick single sputtered Cr layer: [Cr(sp)].

(b) A 2,000 Å thick single sputtered Ni—Fe layer: [Ni—Fe(sp)].

(c) A sputtered 2,000 Å thick Ni—Fe layer over a 300 Å thick sputtered Cr layer: [Ni—Fe(sp)/Cr(sp)].

(d) A plated 1.0 μm thick Ni—Fe layer over a 1,000 Å thick sputtered Ni—Fe layer: [Ni—Fe(pl)/Ni—Fe(sp)].

(e) A sputtered 2,000 Å thick Cu layer over a 300 Å thick sputtered Cr layer: [Cu(sp)/Cr(sp)].

(f) A sputtered 2,000 Å thick Cu layer over a 1,000 Å thick sputtered Ni—Fe layer: [Cu(sp)/Ni—Fe(sp)].

(g) A plated 1.0 μm thick Cu layer over a 1,000 Å thick Cu sputtered layer over a 300 Å thick sputtered Cr layer: [Cu(pl)/Cu(sp)/Cr(sp)].

In all of these experiments the metallic masks provided only a limited protection and only for short exposure times. Although Cr and Ni—Fe layers by themselves are not attacked or etched by the dilute HF etchant, they are porous. As a result, with time, the etchant penetrates through pin-hole pores in the mask, gradually increasing the pin-hole size and attacking the alumina underneath. The worst case was the single Cr mask of experiment (a). Visible holes could be seen (under the microscope) after/only a few minutes of exposure to the dilute (1:2) HF etchant. They increased in size with exposure time. After a 10 minutes exposure with this mask, defective areas with large holes covered about 30–50% of the protected masked areas. The wafer looked like Swiss cheese. The porosity of these metallic layers decreased as their thickness increased. The masks of experiments (b), (c), and (d) provided increasing protection, in this order. However, even a plated 1.0 μm thick Ni—Fe layer was not completely free of pores. Pin-holes were already detected on the mask of (d) after about 30 minutes of etching, and their size was significant after 50 minutes of etching. The Cu layers usually include fewer pores than the Cr or Ni—Fe layers, but they are slowly attacked (or etched) by the HF (1:2) etchant. The mask of experiment (g) provided adequate protection for up to about 35 minutes in the dilute HF (1:2) etchant.

While the invention has been particularly described with reference to preferred embodiments, it will be understood by those skilled in the art that various changes in form and detail may be made therein without departing from the spirit, scope, and teaching of the invention. For example, the process disclosed for etching thick alumina layers has numerous applications and may be used for purposes other than forming the vias in a TFH devices. Accordingly, examples herein disclosed are to be considered merely as illustrative and the invention to be limited only as specified in the claims.

We claim:

1. A process for pattern-etching an alumina layer, the process comprising:

forming an alumina layer over a substrate;

forming a mask over said alumina layer, said mask comprising at least one metallic layer and at least one photoresist layer disposed over said at least one metallic layer, said at least one metallic layer comprising a bottom adhesion metallic layer and a top metallic layer, said top metallic layer and said bottom adhesion metallic layer are the same metallic layer when said at least one metallic layer comprises a single metallic layer, said at least one metallic layer having at least one opening formed therethrough by etching a portion of the top metallic layer through at least one opening in the photoresist layer and removing a portion of other underlying metallic layers, if any, through the at least one opening in said top metallic layer, said at least one opening in said at least one metallic layer defining at least one location for etching the alumina layer;

etching at least a portion of said alumina layer by solely applying a wet alumina etchant through said at least one opening in said at least one metallic layer to pattern-etch said alumina layer, said wet alumina etchant comprising HF and said at least one metallic layer being substantially free of pores and substantially immune from etching by said wet alumina etchant; and removing said at least one photoresist layer.

2. The process of claim 1 wherein the alumina etchant comprises a solution of HF having a concentration in the range of 10% to 25% by weight.

3. The process of claim 2 wherein said concentration of HF is approximately 16% by weight.

4. The process of claim 1 wherein the depth of etching of said alumina is determined by interrupting the etching of said alumina layer after a predetermined period of time.

5. The process of claim 1 wherein the depth of etching of said alumina is determined by an etch-stop layer which is disposed at a selected depth in the alumina layer.

6. A process for pattern-etching an alumina layer, the process comprising:

forming an alumina layer over a substrate;

depositing at least one metallic layer over said alumina layer, said at least one metallic layer comprising a bottom adhesion metallic layer and a top metallic layer, said top metallic layer and said bottom adhesion metallic layer are the same metallic layer when said at least one metallic layer comprises a single metallic layer;

forming a photoresist mask over said top metallic layer, said photoresist mask having formed therethrough at least one opening exposing the top metallic layer;

forming a metallic mask by removing a portion of said top metallic layer exposed through the at least one opening in said photoresist mask, thereby forming at least one opening in said top metallic layer, and by removing a portion of other underlying metallic layers, if any, through the at least one opening in said top metallic layer, thereby forming at least one opening in said metallic mask exposing the alumina layer; and etching at least a portion of said alumina layer exposed through said at least one opening in said metallic mask by applying a wet alumina etchant to pattern-etch said alumina layer, said wet alumina etchant comprising HF, said at least one metallic layer being substantially free of pores and substantially immune from etching by said wet alumina etchant, and said photoresist mask is removed prior to the step of etching the at least a portion of the alumina layer.

7. The process of claim 6 wherein the alumina etchant comprises a solution of HF having a concentration in the range of 10% to 25% by weight.

8. The process of claim 7 wherein said concentration of HF is approximately 16% by weight.

9. The process of claim 1 wherein said bottom adhesion metallic layer comprises a material selected from the group consisting of Cr, Ti, W, Ta, Mo, Nb, V, Zr, Hf, Ni—Fe, Ni—Co, Ni—Co—Fe, and alloys comprising one or more of these materials, and wherein any additional metallic layer of said at least one metallic layer, if any, comprises a material selected from the group consisting of Cr, Ti, W, Ta, Mo, Nb, V, Zr, Hf, Ni—Fe, Ni—Co, Ni—Co—Fe, Cd, In, Au, Cu, Ag, Pd, Pt, Rh, Ir, and alloys comprising one or more of these materials.

10. The process of claim 1 wherein said bottom adhesion metallic layer comprises a material selected from the group consisting of Ni—Fe, Ni, Fe, Cr, Ti, W, Ta, Mo, Nb, V, Zr, Hf, and alloys comprising one or more of these materials.

11. The process of claim 1 wherein said bottom adhesion metallic layer comprises a material selected from the group consisting of Ni—Fe, Cr, Ti, W, Ta, and alloys comprising one or more of these materials.

12. The process of claim 1 wherein said bottom adhesion metallic layer comprises Cr.

13. The process of claim 1 wherein said at least one metallic layer comprises a seed layer and at least one plated metallic layer formed over said seed layer.

14. A process for pattern-etching an alumina layer, the process comprising:

forming an alumina layer over a substrate;

depositing a bottom adhesion metallic layer over the alumina layer;

depositing at least one additional metallic layer, one of which at least one additional metallic layer is a top metallic layer, over the bottom adhesion metallic layer;

forming a photoresist mask over the top metallic layer;

etching the top metallic layer through the photoresist mask;

etching through the top metallic layer, in reverse order of deposition, all other metallic layers;

wet etching the alumina layer with a wet alumina etchant through all metallic layers; and removing all the metallic layers.

15. The process of claim 14 wherein the photoresist mask is removed prior to etching the alumina layer.

16. The process of claim 14 wherein said wet alumina etchant comprises one or more chemicals selected from the group consisting of HF, $H_3PO_4$, KOH, NaOH, $Ca(OH)_2$, and strong organic amine bases.

17. The process of claim 14 wherein said wet alumina etchant comprises HF and water.

18. The process of claim 17 wherein the alumina etchant comprises a solution of HF having a concentration in the range of 10% to 25% by weight.

19. The process of claim 18 wherein said concentration of HF is approximately 16% by weight.

20. The process of claim 14 wherein said bottom adhesion metallic layer comprises a material selected from the group consisting of Ni—Fe, Ni, Fe, Cr, Ti, W, Ta, Mo, Nb, V, Zr, Hf, and alloys comprising one or more of these materials.

21. The process of claim 14 wherein said bottom adhesion metallic layer comprises a material selected from the group consisting of Ni—Fe, Cr, Ti, W, Ta, and alloys comprising one or more of these materials.

22. The process of claim 14 wherein said bottom adhesion metallic layer comprises Cr.

23. The process of claim 22 wherein said wet alumina etchant comprises HF.

24. The process of claim 14 wherein the depth of etching of said alumina is determined by interrupting the etching of said alumina layer after a predetermined period of time.

25. The process of claim 14 wherein the depth of etching of said alumina is determined by an etch-stop layer which is disposed at a selected depth in the alumina layer.

26. The process of claim 14 wherein said at least one additional metallic layer comprises a seed layer formed over said bottom adhesion metallic layer and at least one plated metallic layer formed over said seed layer.

27. A process for pattern-etching an alumina layer, the process comprising:

depositing an alumina layer on a substrate;

depositing on the alumina layer one or more metallic layers which include a bottom adhesion metallic layer;

forming a photoresist layer over the one or more metallic layers;

forming a photoresist mask by forming at least one opening through the photoresist layer to expose a portion of said one or more metallic layers, said at least one opening defining the location of at least one crater;

removing a portion of said one or more metallic layers through the at least one opening in the photoresist layer to form at least one opening in the one or more metallic layers thereby exposing the underlying alumina layer;

etching the alumina layer through the at least one opening in the adhesion metallic layer with a wet alumina etchant, wherein at least one of said one or more metallic layers is substantially free of pores and substantially immune from etching by said wet alumina etchant;

removing the photoresist mask; and removing the one or more metallic layers.

28. The process of claim 27 wherein said wet alumina etchant comprises one or more chemicals selected from the group consisting of HF, $H_3PO_4$, KOH, NaOH, $Ca(OH)_2$, and strong organic amine bases.

29. The process of claim 27 wherein said wet alumina etchant comprises HF and water.

30. The process of claim 29 wherein the alumina etchant comprises a solution of HF having a concentration in the range of 10% to 25% by weight.

31. The process of claim 30 wherein said concentration of HF is approximately 16% by weight.

32. The process of claim 27 wherein said bottom adhesion metallic layer comprises a material selected from the group consisting of Ni—Fe, Ni, Fe, Cr, Ti, W, Ta, Mo, Nb, V, Zr, Hf, and alloys comprising one or more of these materials.

33. The process of claim 27 wherein said bottom adhesion metallic layer comprises a material selected from the group consisting of Ni—Fe, Cr, Ti, W, Ta, and alloys comprising one or more of these materials.

34. The process of claim 27 wherein said bottom adhesion metallic layer comprises Cr.

35. The process of claim 34 wherein said wet alumina etchant comprises HF.

36. The process of claim 27 wherein the depth of etching of said alumina is determined by interrupting the etching of said alumina layer after a predetermined period of time.

37. The process of claim 27 wherein the depth of etching of said alumina is determined by an etch-stop layer which is disposed at a selected depth in the alumina layer.

38. The process of claim 27 wherein said one or more metallic layers comprises a seed layer and at least one plated metallic layer formed over said seed layer.

39. A process for pattern-etching an alumina layer, the process comprising:

depositing an alumina layer over a substrate;

depositing over the alumina layer a first mask comprising at least one metallic layer, said at least one metallic layer comprising a bottom adhesion metallic layer and a top metallic layer, said top metallic layer and said bottom adhesion metallic layer are the same metallic layer when said at least one metallic layer comprises a single metallic layer;

forming a photoresist mask having at least one opening over the top metallic layer exposing the top metallic layer;

pattern-etching at least one opening in the first mask to expose a surface of the alumina layer by etching a portion of the top metallic layer through the at least one opening in the photoresist mask and removing a portion of other underlying metallic layers, if any, through the at least one opening in said top metallic layer; and pattern-etching the alumina layer with a wet alumina etchant comprising HF through the at least one opening in the first mask, wherein the first mask is substantially free of pores and substantially immune against attack by the alumina etchant.

40. The process of claim 39 wherein said wet alumina etchant comprises HF and water.

41. The process of claim 40 wherein the alumina etchant comprises a solution of HF having a concentration in the range of 10% to 25% by weight.

42. The process of claim 41 wherein said concentration of HF is approximately 16% by weight.

43. The process of claim 39 wherein said bottom adhesion metallic layer comprises a material selected from the group consisting of Cr, Ti, W, Ta, Mo, Nb, V, Zr, Hf, Ni—Fe, Ni—Co, Ni—Co—Fe, and alloys comprising one or more of these materials, and wherein any additional metallic layer of said at least one metallic layer, if any, comprises a material selected from the group consisting of Cr, Ti, W, Ta, Mo, Nb, V, Zr, Hf, Ni—Fe, Ni—Co, Ni—Co—Fe, Cd, In, Au, Cu, Ag, Pd, Pt, Rh, Ir, and alloys comprising one or more of these materials.

44. The process of claim 39 wherein said bottom adhesion metallic layer comprises a material selected from the group consisting of Ni—Fe, Ni, Fe, Cr, Ti, W, Ta, Mo, Nb, V, Zr, Hf, and alloys comprising one or more of these materials.

45. The process of claim 39 wherein said bottom adhesion metallic layer comprises a material selected from the group consisting of Ni—Fe, Cr, Ti, W, Ta, and alloys comprising one or more of these materials.

46. The process of claim 39 wherein said bottom adhesion metallic layer comprises Cr.

47. The process of claim 39 wherein said at least one metallic layer comprises a seed layer and at least one plated metallic layer formed over said seed layer.

48. A process for pattern-etching an alumina layer, the process comprising:

forming an alumina layer over a substrate;

forming a mask over said alumina layer, said mask comprising at least one metallic layer, said at least one metallic layer comprising a bottom adhesion metallic layer and a top metallic layer, said top metallic layer and said bottom adhesion metallic layer are the same metallic layer when said at least one metallic layer comprises a single metallic layer, said mask having formed therethrough at least one opening; and etching at least a portion of said alumina layer by solely applying a wet alumina etchant, comprising HF, through said at least one opening to pattern-etch said alumina layer, said at least one metallic layer being substantially free of pores and substantially immune from etching by said wet alumina etchant, said step of forming a mask comprises:

forming a photoresist layer over said top metallic layer;

forming at least one opening through said photoresist layer to expose a portion of said top metallic layer; and removing a portion of said top metallic layer exposed through the at least one opening in said photoresist layer and removing a portion of other underlying metallic layers, if any, through the at least one opening in said top metallic layer.

49. The process of claim 48 wherein said wet alumina etchant comprises HF and water.

50. The process of claim 49 wherein the alumina etchant comprises a solution of HF having a concentration in the range of 10% to 25% by weight.

51. The process of claim 50 wherein said concentration of HF is approximately 16% by weight.

52. The process of claim 48 wherein said bottom adhesion metallic layer comprises a material selected from the group consisting of Cr, Ti, W, Ta, Mo, Nb, V, Zr, Hf, Ni—Fe, Ni—Co, Ni—Co—Fe, and alloys comprising one or more of these materials, and wherein any additional metallic layer of said at least one metallic layer, if any, comprises a material selected from the group consisting of Cr, Ti, W, Ta, Mo, Nb, V, Zr, Hf, Ni—Fe, Ni—Co, Ni—Co—Fe, Cd, In, Au, Cu, Ag, Pd, Pt, Rh, Ir, and alloys comprising one or more of these materials.

53. The process of claim 48 wherein said bottom adhesion metallic layer comprises a material selected from the group consisting of Ni—Fe, Ni, Fe, Cr, Ti, W, Ta, Mo, Nb, V, Zr, Hf, and alloys comprising one or more of these materials.

54. The process of claim 48 wherein said bottom adhesion metallic layer comprises a material selected from the group consisting of Ni—Fe, Cr, Ti, W, Ta, and alloys comprising one or more of these materials.

55. The process of claim 48 wherein said bottom adhesion metallic layer comprises Cr.

56. The process of claim 48 wherein the depth of etching of said alumina is determined by interrupting the etching of said alumina layer after a predetermined period of time.

57. The process of claim 48 wherein the depth of etching of said alumina is determined by an etch-stop layer which is disposed at a selected depth in the alumina layer.

58. The process of claim 48 wherein said at least one metallic layer comprises a seed layer and at least one plated metallic layer formed over said seed layer.

59. The process of claim 6 wherein said bottom adhesion metallic layer comprises a material selected from the group consisting of Cr, Ti, W, Ta, Mo, Nb, V, Zr, Hf, Ni—Fe, Ni—Co, Ni—Co—Fe, and alloys comprising one or more of these materials, and wherein any additional metallic layer of said at least one metallic layer, if any, comprises a material selected from the group consisting of Cr, Ti, W, Ta, Mo, Nb, V, Zr, Hf, Ni—Fe, Ni—Co, Ni—Co—Fe, Cd, In, Au, Cu, Ag, Pd, Pt, Rh, Ir, and alloys comprising one or more of these materials.

* * * * *